United States Patent
Chang et al.

(10) Patent No.: US 9,761,651 B2
(45) Date of Patent: Sep. 12, 2017

(54) TRANSPARENT ORGANIC LIGHT EMITTING DISPLAY APPARATUS AND METHOD OF MANUFACTURING THE SAME

(71) Applicant: Samsung Display Co., LTD., Yongin-si, Gyeonggi-Do (KR)

(72) Inventors: Young-Jin Chang, Suwon-si (KR); Mu-Gyeom Kim, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/941,299

(22) Filed: Nov. 13, 2015

(65) Prior Publication Data
US 2016/0293687 A1 Oct. 6, 2016

(30) Foreign Application Priority Data
Mar. 31, 2015 (KR) .................. 10-2015-0044741

(51) Int. Cl.
*H01L 27/32* (2006.01)
*H01L 51/52* (2006.01)

(52) U.S. Cl.
CPC ........ *H01L 27/3272* (2013.01); *H01L 27/326* (2013.01); *H01L 51/5284* (2013.01); *H01L 27/322* (2013.01); *H01L 27/3246* (2013.01); *H01L 27/3258* (2013.01)

(58) Field of Classification Search
CPC ............. H01L 27/3272; H01L 51/5284; H01L 2227/323; H01L 27/322
USPC .......................................... 257/40
See application file for complete search history.

(56) References Cited

U.S. PATENT DOCUMENTS

| 2009/0295731 A1 | 12/2009 | Kim et al. | |
| 2012/0267611 A1* | 10/2012 | Chung | H01L 27/3211 257/40 |
| 2013/0063358 A1 | 3/2013 | Huang | |
| 2015/0187857 A1* | 7/2015 | Negishi | H01L 27/3272 257/40 |

FOREIGN PATENT DOCUMENTS

| JP | 2010-056025 | 3/2010 |
| JP | 2014-049313 | 3/2014 |
| KR | 10-2014-0069674 | 6/2014 |

* cited by examiner

*Primary Examiner* — Karen Kusumakar
*Assistant Examiner* — Adam S Bowen
(74) *Attorney, Agent, or Firm* — Innovation Counsel LLP

(57) ABSTRACT

A transparent organic light emitting display apparatus include a base substrate, a light blocking pattern disposed on the base substrate, a thin film transistor disposed on the base substrate, a first electrode disposed on the base substrate and electrically connected to the thin film transistor, a pixel defining layer disposed on the base substrate and overlapping the first light blocking pattern, a second electrode disposed on the base substrate, a light emitting structure disposed between the first electrode and the second electrode, and a second light blocking pattern overlapping the first light blocking pattern. The first light blocking pattern defines a first opening. The second light blocking pattern defines a second opening which overlaps the first opening. The pixel defining layer defines a third opening which overlaps the first and second openings configured to pass external light through the first to third openings.

20 Claims, 31 Drawing Sheets

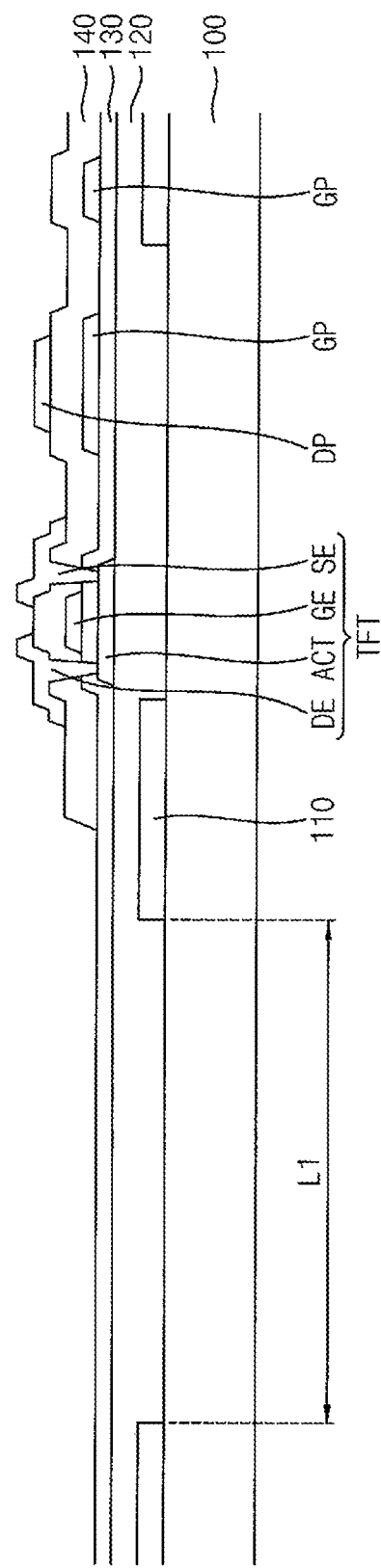

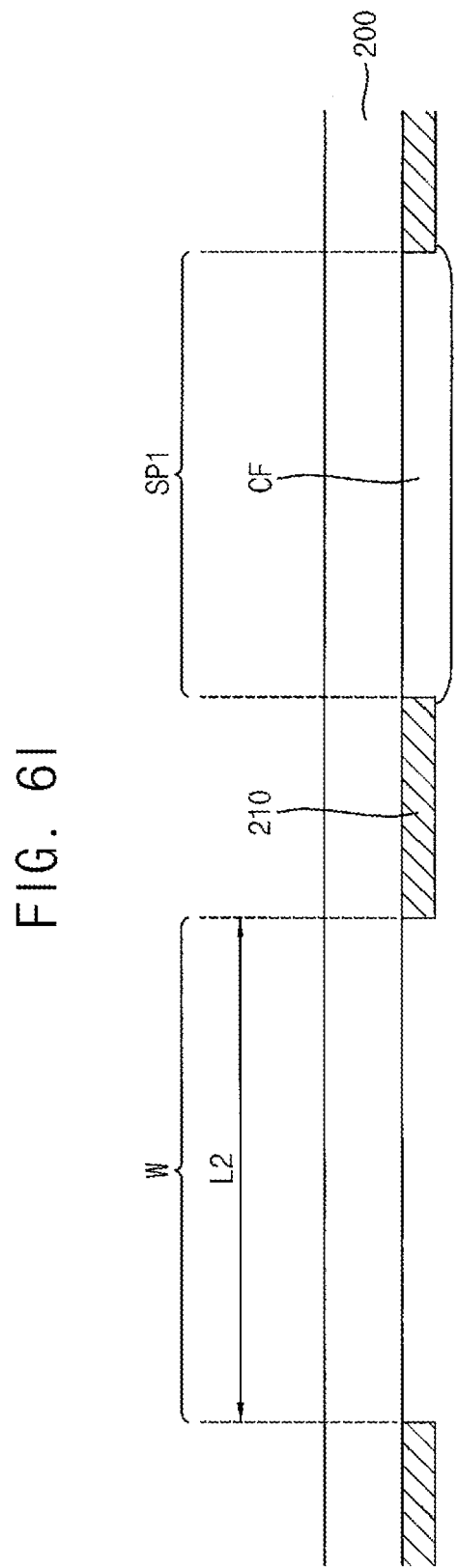

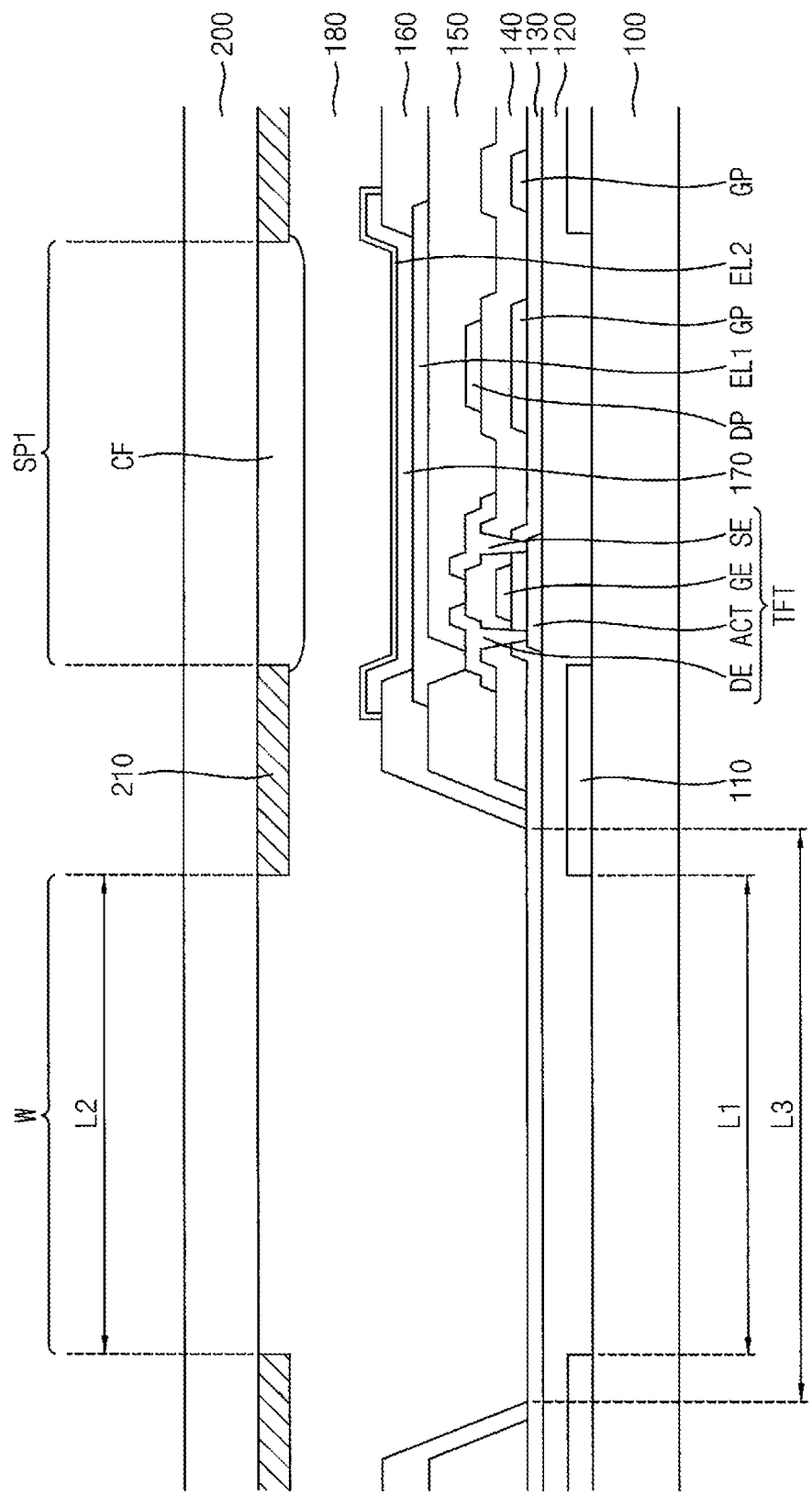

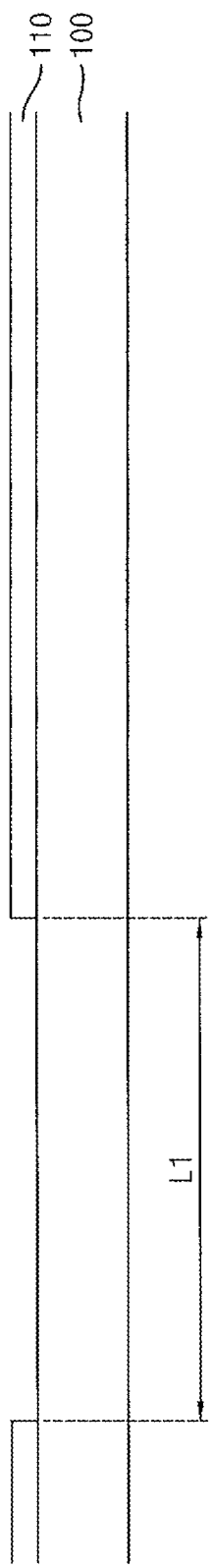

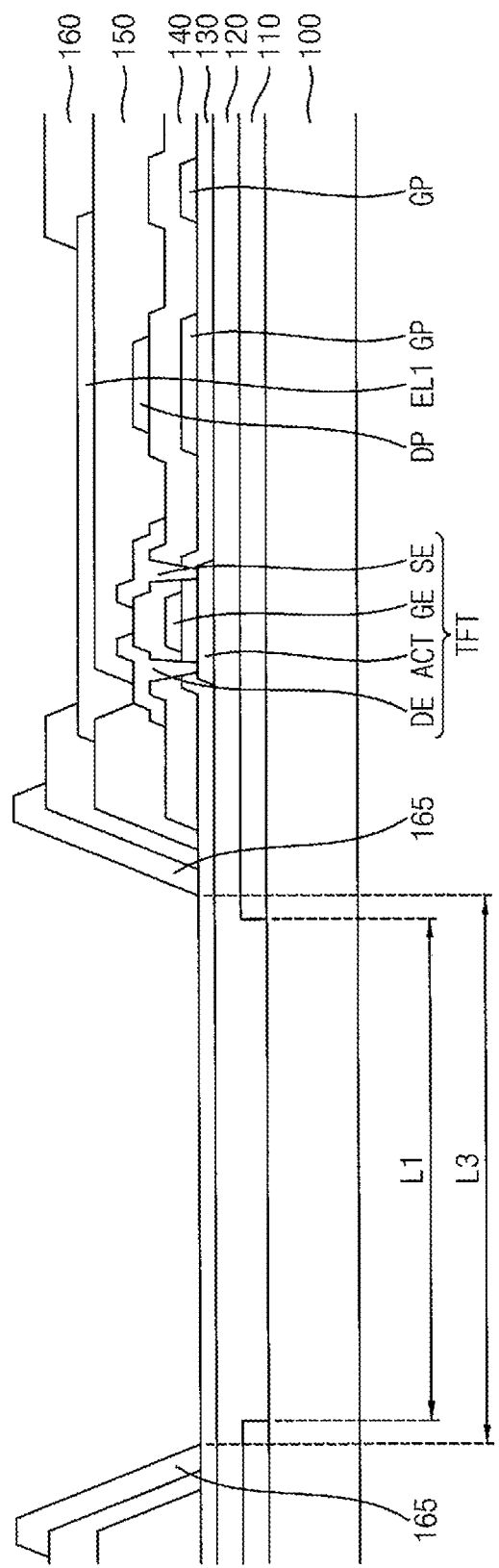

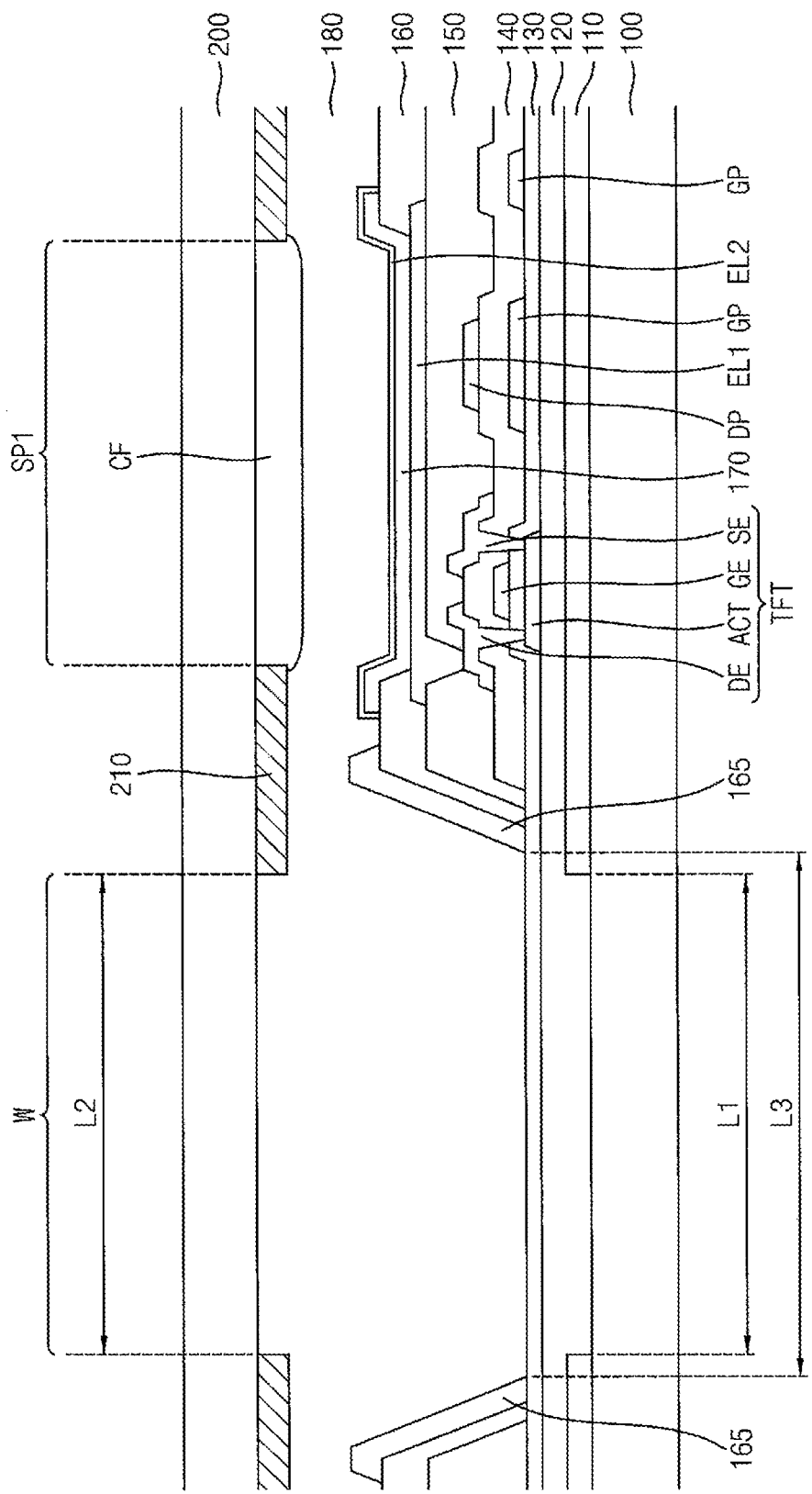

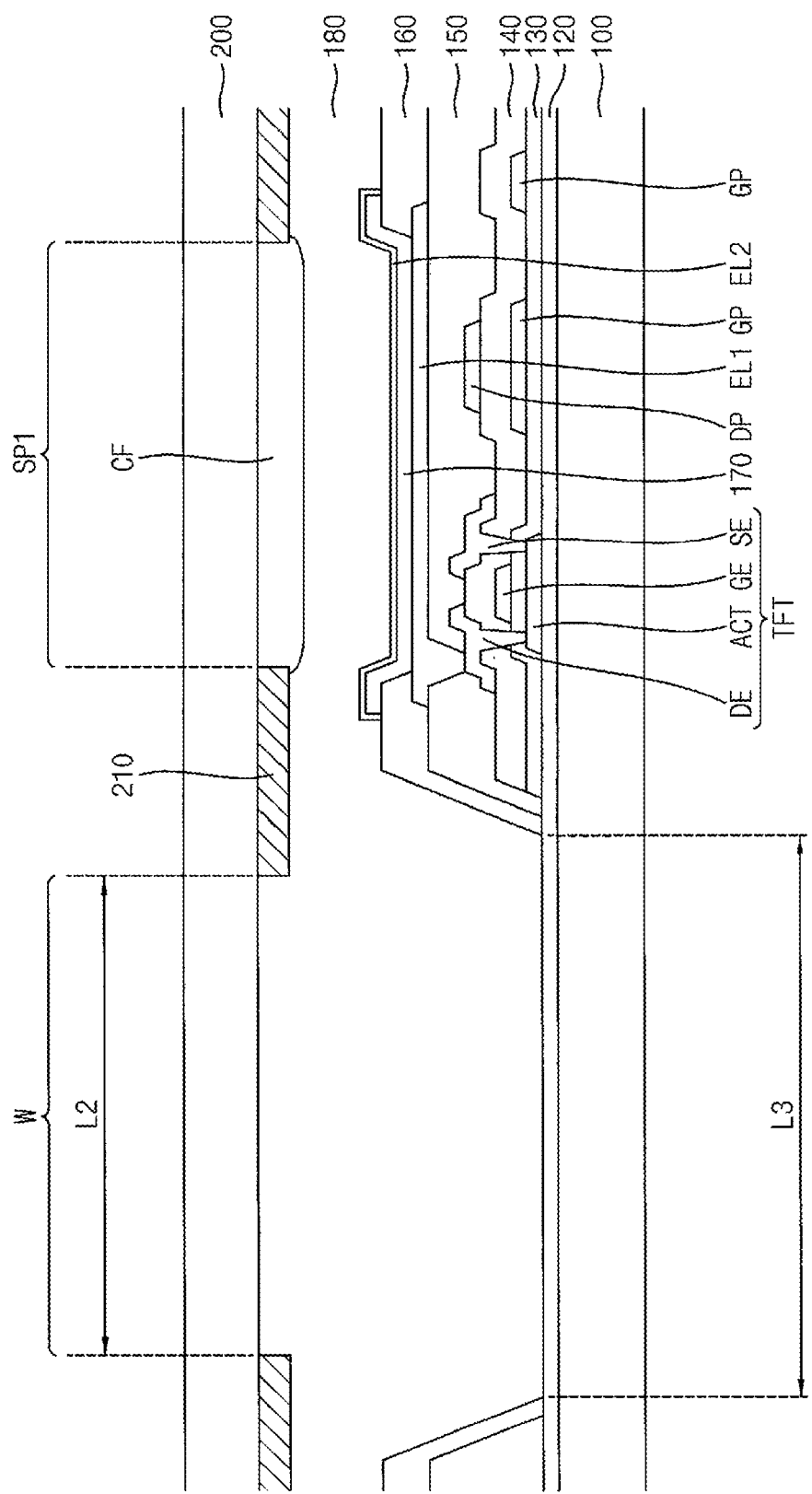

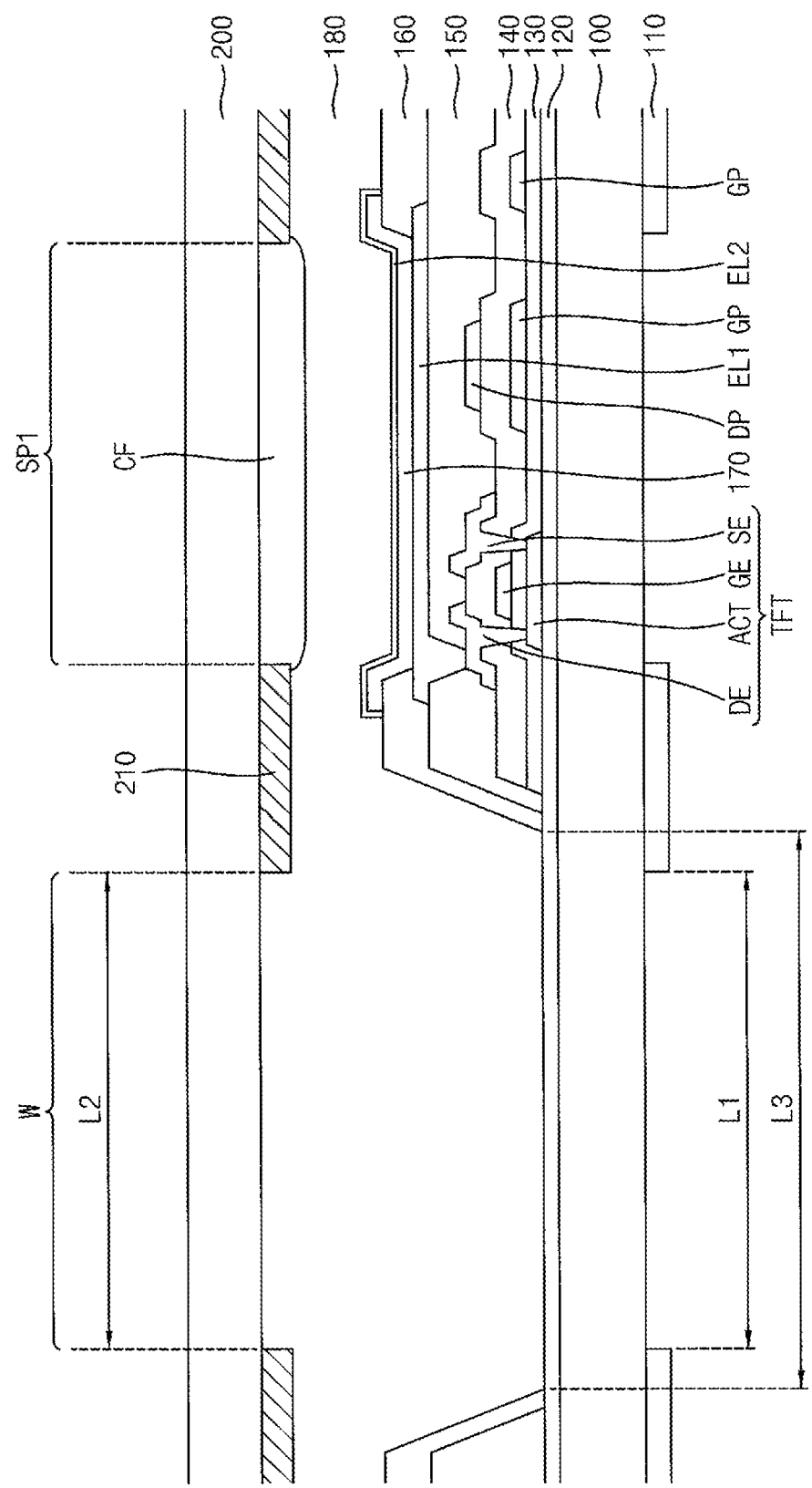

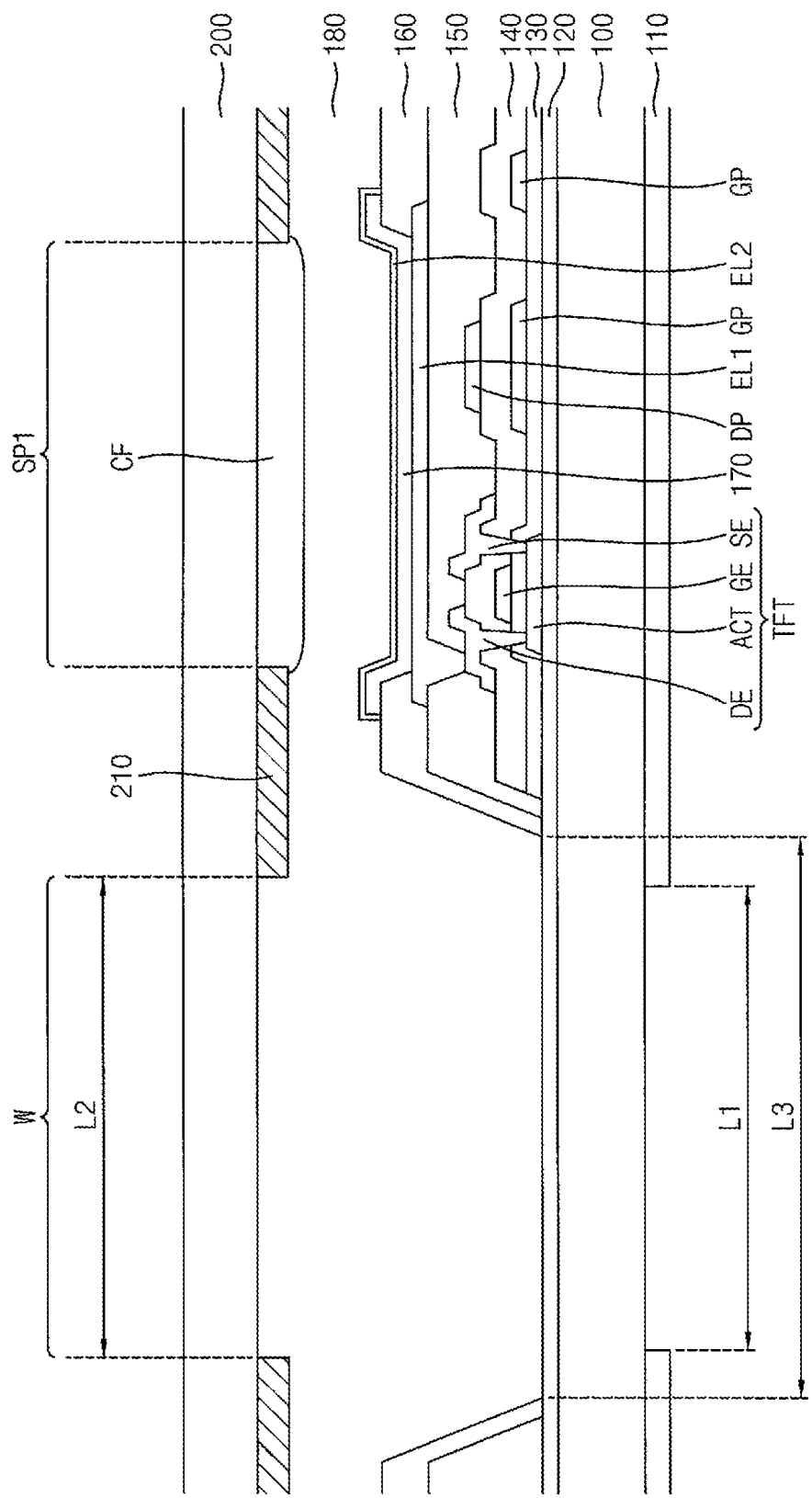

TRANSPARENT ORGANIC LIGHT EMITTING DISPLAY APPARATUS AND METHOD OF MANUFACTURING THE SAME

This application claims priority under 35 U.S.C. §119 to Korean Patent Application No. 10-2015-0044741, filed on Mar. 31, 2015, the disclosure of which is incorporated by reference herein in its entirety.

BACKGROUND

1. Field

Example embodiments of the inventive concept relate to a display apparatus and a method of manufacturing the display apparatus. More particularly, example embodiments of the inventive concept relate to a transparent organic light emitting display apparatus and a method of manufacturing the display apparatus.

2. Description of the Related Art

A display device displays an image using a pixel emitting light. An organic light emitting display device includes the pixel having an organic light emitting diode (OLED). The OLED emits the light of which wavelength depends on an organic material included in the OLED. For example, the OLED includes the organic material corresponding to one of a red color light, a green color light, and a blue color light. The organic light emitting display device displays the image by mixing the light emitted by the organic materials.

Recently, a transparent display apparatus which can display an image and pass external light has been actively developed. The transparent display apparatus may transmit the external light, so that users may see an object which is disposed behind the transparent display apparatus.

Here, elements disposed near a transparent window may cause reflection of the external light, so that sharpness of a transmitted image may be decreased.

SUMMARY

Example embodiments provide a transparent organic light emitting display apparatus capable of improving sharpness of a transmitted image.

Example embodiments also provide a method of manufacturing the transparent organic light emitting display apparatus.

According to some example embodiments, a transparent organic light emitting display apparatus include a base substrate, a light blocking pattern disposed on the base substrate, a thin film transistor disposed on the base substrate, a first electrode disposed on the base substrate and electrically connected to the thin film transistor, a pixel defining layer disposed on the base substrate and overlapping the first light blocking pattern, a second electrode disposed on the base substrate, a light emitting structure disposed between the first electrode and the second electrode, and a second light blocking pattern overlapping the first light blocking pattern. The first light blocking pattern defines a first opening. The second light blocking pattern defines a second opening which overlaps the first opening. The pixel defining layer defines a third opening which overlaps the first and second openings configured to pass external light through the first to third openings.

In example embodiments, a width of the first opening may be smaller than a width of the third opening. A width of the second opening may be smaller than a width of the third opening.

In example embodiments, the width of the first opening may be substantially same as the width of the second opening.

In example embodiments, a gap between a boundary of the first opening and a boundary of the third opening may be about 1 μm to about 5 μm in a plan view. A gap between a boundary of the second opening and a boundary of the third opening may be about 1 μm to about 5 μm in a plan view.

In example embodiments, the gap between the boundary of the first opening and the boundary of the third opening may be uniform.

In example embodiments, the first light blocking pattern may be disposed opposite to the thin film transistor with respect to the base substrate.

In example embodiments, the transparent organic light emitting display apparatus may further include a third light blocking pattern disposed on the pixel defining layer a and spaced apart from the light emitting structure. The third light blocking pattern may define a fourth opening which covers a boundary of the third opening and overlap the first and second openings.

In example embodiments, a width of the first opening may be smaller than a width of the fourth opening. A width of the second opening may be smaller than a width of the fourth opening.

In example embodiments, the transparent organic light emitting display apparatus may further include a color filter disposed on the second electrode. The second light blocking pattern may make contact with the color filter.

In example embodiments, the transparent organic light emitting display apparatus may further include a sealing substrate. The color filter and the second light blocking pattern may be disposed on the sealing substrate.

In example embodiments, the transparent organic light emitting display apparatus may further include a buffer layer covering the base substrate. The buffer layer may be disposed between the base substrate and the thin film transistor. The first light blocking pattern may be disposed between the buffer layer and the base substrate.

In example embodiments, the transparent organic light emitting display apparatus may further include a first insulation layer disposed on the buffer layer and a second insulation layer disposed on the first insulation layer. The first and second insulation layers may define an opening where the first to third openings are overlapped each other.

In example embodiments, the transparent organic light emitting display apparatus may further include a thin film encapsulation layer including a plurality of organic films and inorganic films which are alternately stacked, and a color filter disposed on the thin film encapsulation layer and overlapping the light emitting structure. The second light blocking pattern may be disposed on the thin film encapsulation layer and configured to expose the color filter.

In example embodiments, the first light blocking pattern may make contact with the base substrate.

According to some example embodiments, a method of manufacturing a transparent organic light emitting display apparatus include forming a first light blocking pattern on a base substrate, forming a thin film transistor on the base substrate, forming a pixel defining layer on the base substrate on which the thin film transistor is formed, forming a light emitting structure on the base substrate on which the pixel defining layer is formed, and forming a second light blocking pattern overlapping the pixel defining layer. The first light blocking pattern defines a first opening. The second light blocking pattern defines a second opening which overlaps the first opening. The pixel defining layer defines a third opening which overlaps the first and second openings. The first to third openings are configured to pass external light therethrough.

In example embodiments, the method may further include forming a third light blocking pattern on the pixel defining layer before forming the light emitting structure. The third light blocking pattern may be spaced apart from the light emitting structure.

In example embodiments, the method may further include a color filter overlapping the light emitting structure before forming the second light blocking pattern.

In example embodiments, the method may further include forming a buffer layer on the base substrate on which the first light blocking pattern is formed before forming the thin film transistor.

In example embodiments, the first light blocking pattern may be formed by attaching a light blocking film on the base substrate.

According to some example embodiments, a transparent organic light emitting display apparatus includes a transparent window configured to pass external light therethrough and a pixel configured to display an image. The transparent organic light emitting display apparatus includes a first light blocking pattern defining a first opening corresponding to the transparent window, a second light blocking pattern overlapping the first light blocking pattern, and an opaque elements disposed between the first light blocking pattern and the second light blocking pattern. The second light blocking pattern defines a second opening overlapping the first opening. The opaque elements define a third opening overlapping the first opening and the second opening. The third opening is substantially larger than the first opening and the second opening.

Therefore, a transparent organic light emitting display apparatus may include a pixel defining layer, a first light blocking pattern and a second light blocking pattern. A boundary of the pixel defining layer may be covered by the first light blocking pattern and the second light blocking pattern, so that reflection of external light passing a transparent window by elements of the transparent organic light emitting display apparatus may be decreased. Thus, quality of a transmitted image by the external light may be improved.

In addition, the transparent organic light emitting display apparatus may include a third light blocking pattern disposed on boundary side surfaces of an opening of the pixel defining layer which corresponds to the transparent window. Reflection of external light passing the transparent window by the elements of the transparent organic light emitting display apparatus may be decreased by the first to third light blocking patterns. Thus, quality of a transmitted image by the external light may be improved.

BRIEF DESCRIPTION OF THE DRAWINGS

The above and other features of the inventive concept will become more apparent by describing in detail example embodiments thereof with reference to the accompanying drawings, in which:

FIGS. 6A, 6B, 6C, 6D, 6E, 6F, 6G 6H, 6I and 6J are cross-sectional views illustrating a method of manufacturing the transparent organic light emitting display apparatus of FIG. 2;

FIGS. 7A, 7B, 7C, 7D and 7E are cross-sectional views illustrating a method of manufacturing the transparent organic light emitting display apparatus of FIG. 3;

FIGS. 8A, 8B, 8C and 8D are cross-sectional views illustrating a method of manufacturing the transparent organic light emitting display apparatus of FIG. 4;

FIGS. 9A and 9B are cross-sectional views illustrating another method of manufacturing the transparent organic light emitting display apparatus of FIG. 4.

DETAILED DESCRIPTION

Hereinafter, the inventive concept will be explained in detail with reference to the accompanying drawings.

Figure 1:
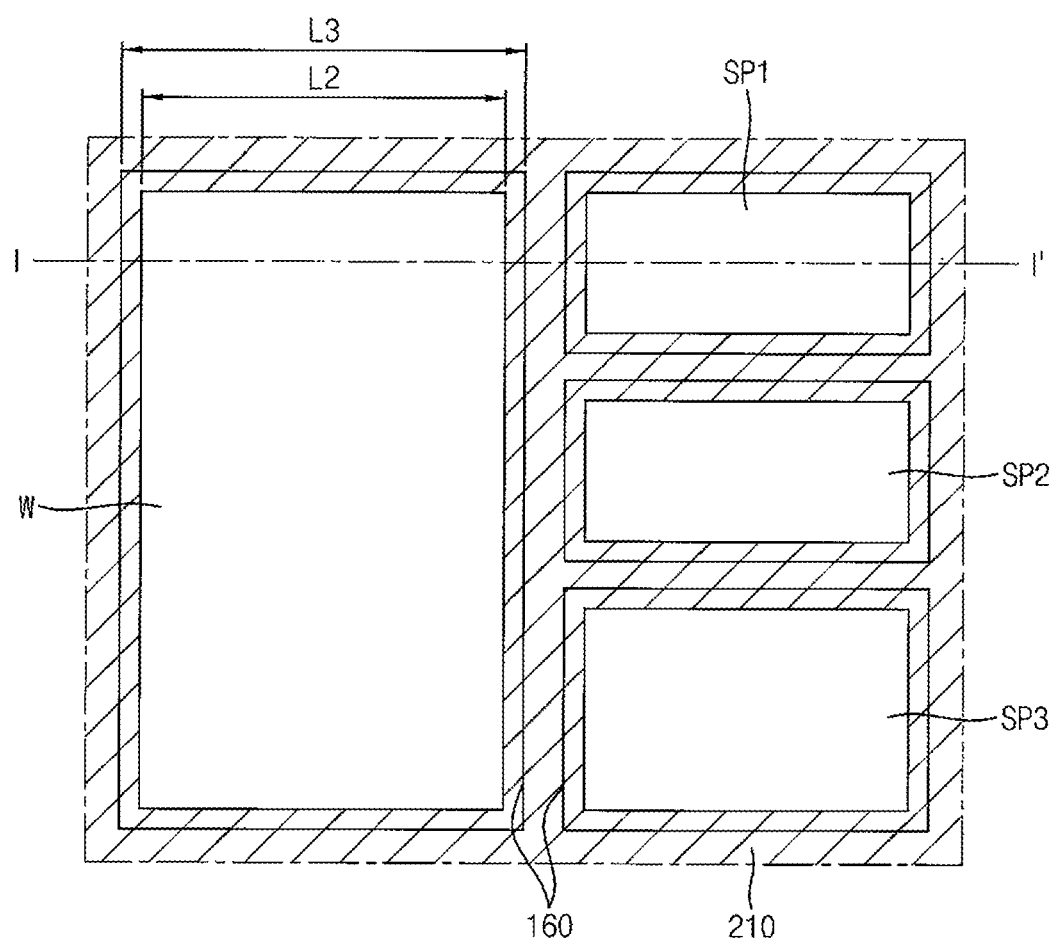
FIG. 1 is a plan view illustrating a pixel of a transparent organic light emitting display apparatus according to an example embodiment of the inventive concept.

FIG. 1 is a plan view illustrating a pixel of a transparent organic light emitting display apparatus according to an example embodiment of the inventive concept.

Referring to FIG. 1, the transparent organic light emitting display apparatus may include a plurality of pixels. Each of plurality of pixels may include a transparent window W and a plurality of sub-pixels. According to the present example embodiment, each of the plurality of pixels of the transparent organic light emitting display apparatus may include the transparent window W, a first sub-pixel SP1, a second sub-pixel SP2 and a third sub-pixel SP3.

Each of the first to third light emitting portions (refers to 170 of FIG. 2) may be disposed corresponding to each of the first to third sub-pixels SP1 to SP3, respectively.

The first light emitting portion, the second light emitting portion and the third light emitting portion may emit lights having different colors according to driving of the pixels of the transparent organic light emitting display apparatus. For example, the first light emitting portion may emit red light, the second light emitting portion may emit green light, and the third light emitting portion may emit blue light.

The transparent window W may pass external light, so that users may see an object behind the transparent organic light emitting display apparatus through the transparent window W.

A pixel defining layer 160 is disposed on a first base substrate 100. A second light blocking pattern 210 (painted in gray) which is disposed on a second base substrate 200 may define the transparent window W and the first to third sub-pixels SP1 to SP3. Thus, an opening formed through the second light blocking pattern 210 may define the transparent window W, and the opening may have a width which is second length L2 in a first direction.

An opening formed through the pixel defining layer 160 may have a width which is a third length L3 in the first direction.

The second length L2 may be smaller than the third length L3. Thus, the opening formed through the second light blocking pattern 210 may be smaller than the opening formed through the pixel defining layer 160 in the first direction. The opening formed through the second light blocking pattern 210 may be smaller than the opening formed through the pixel defining layer 160 in the second direction. The second direction may be substantially perpendicular to the first direction.

Accordingly, a boundary of the pixel defining layer 160 may be covered by the second light blocking pattern 210. Thus, reflection of the external light, which passes the transparent window W, due to elements of the transparent organic light emitting display apparatus may be decreased, so that quality of a transmitted image by the external light may be improved.

In addition, an opening formed through a first light blocking pattern 110 disposed on the first base substrate 100 (refers to 110 of FIG. 2) may define the transparent window W, and the opening may have a width which is first length (refers to L1 of FIG. 2) in the first direction.

The first length L1 may be smaller than the third length L3. Thus, the opening formed through the first light blocking pattern may be smaller than the opening formed through the pixel defining layer 160. The opening formed through the first light blocking pattern 110 may have a shape substantially same as the opening formed through the second light blocking pattern 210. In addition, in consideration of the alignment error between the first base substrate 100 and the second base substrate 200, the opening formed through the second light blocking pattern 210 may be smaller than the opening formed through the first light blocking pattern 110. Contrary, the opening formed through the first light blocking pattern may be smaller than the opening formed through the second light blocking pattern 210.

Accordingly, the boundary of the pixel defining layer 160 may be covered by the first light blocking pattern. Thus, reflection of the external light, which passes the transparent window W, due to elements of the transparent organic light emitting display apparatus may be decreased, so that quality of a transmitted image by the external light may be improved. Although the pixel includes the transparent window W and sub-pixels in the present example embodiment, it is not to be construed as limited to this specific example embodiment. In one example embodiment, a pixel may include a plurality of transparent windows and a plurality of sub-pixels. In one example embodiment, a transparent window of a pixel may be connected to a transparent window of adjacent pixel.

Figure 2:
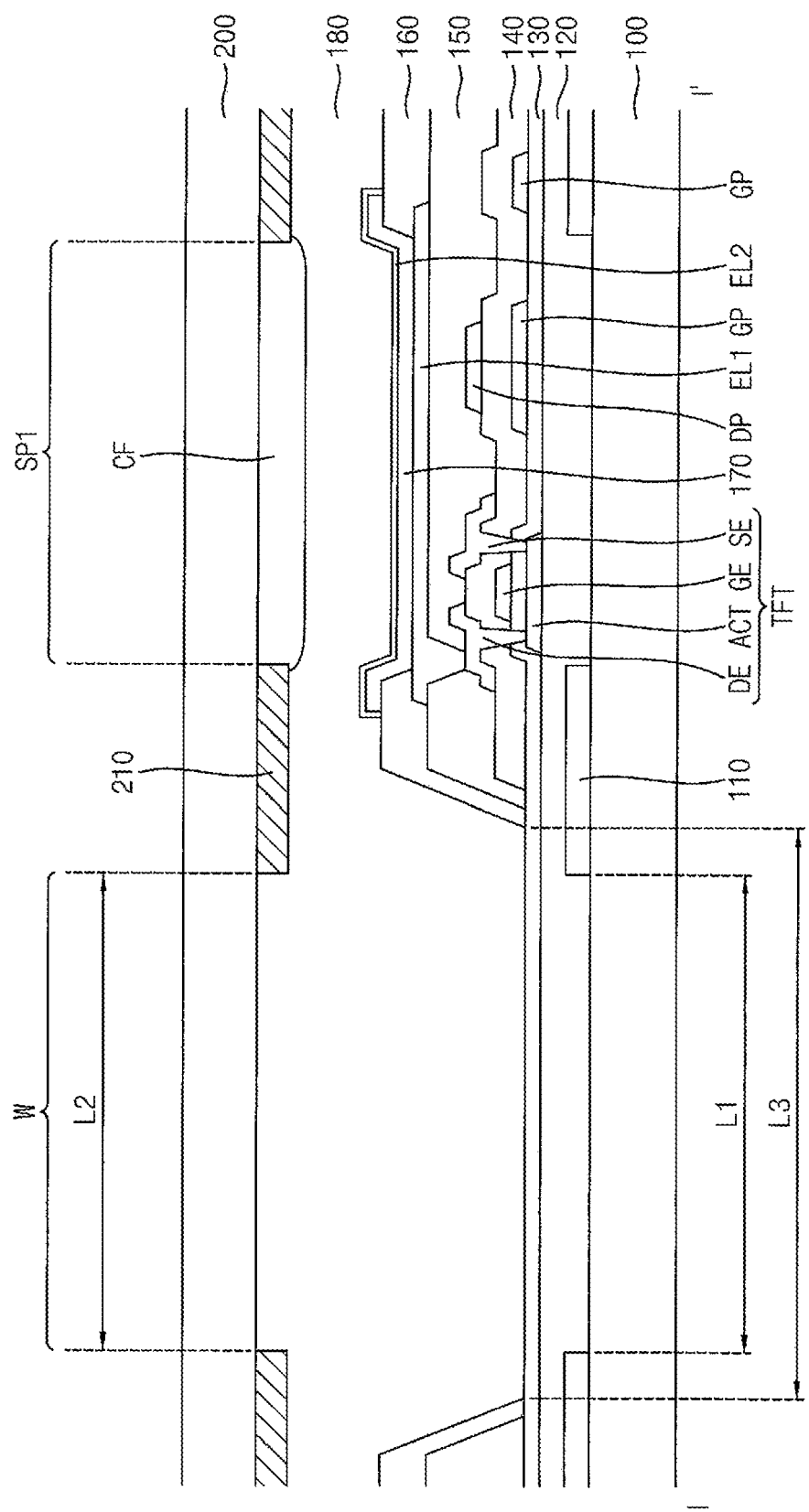
FIG. 2 is a cross-sectional view taken along a line I-I' of FIG. 1.

FIG. 2 is a cross-sectional view taken along a line I-I' of FIG. 1.

Referring to FIG. 2, the transparent organic light emitting display apparatus may include a base substrate 100, a first light blocking pattern 110, a buffer layer 120, a thin film transistor TFT, a first insulation layer 130, a gate pattern GP, a second insulation layer 140, a data pattern DP, a third insulation layer 150, a first electrode EL1, a pixel defining layer 160, a light emitting structure 170, a second electrode EL2, a sealing substrate 200, a second light blocking layer 210, and a color filter CF.

The base substrate 100 may include a transparent insulation substrate. For example, the base substrate 100 may include a glass substrate, a quartz substrate, a transparent resin substrate, etc. Examples of the transparent resin substrate for the base substrate 100 may include polyimide-based resin, acryl-based resin, polyacrylate-based resin, polycarbonate-based resin, polyether-based resin, sulfonic acid containing resin, polyethyleneterephthalate-based resin, etc.

The first light blocking pattern 110 may be disposed on the base substrate 100. The first light blocking pattern 110 may block light. The first light blocking pattern 110 may include organic material or inorganic material which can block light. For example, the first light blocking pattern 110 may be a black matrix pattern including chrome.

The first light blocking pattern 110 may define an opening corresponding to a transparent window W. The opening may have a first length L1 in a first direction. In addition, the first light blocking pattern 110 may form an opening corresponding to a first sub-pixel SP1, a second sub-pixel SP2 and a third sub-pixel SP3.

The buffer layer 120 may be disposed on the base substrate 100 on which the first light blocking pattern 110 is disposed. The buffer layer 120 may prevent diffusion of metal atoms and/or impurities from the base substrate 100. Additionally, the buffer layer 120 may adjust heat transfer rate of a successive crystallization process for an active pattern ACT, to thereby obtaining a substantially uniform active pattern ACT. In case that the base substrate 100 may have a relatively uneven surface, the buffer layer 120 may improve flatness of the surface of the base substrate 100. The buffer layer 120 may be formed using a silicon compound. For example, the buffer layer 120 may include silicon oxide (SiOx), silicon nitride (SiNx), silicon oxynitride (SiOxNy), silicon oxycarbide (SiOxCy), silicon carbon nitride (SiCxNy), etc. These may be used alone or in a combination thereof. The buffer layer 120 may have a single layer structure or a multi layer structure. For example, the buffer layer 120 may have a single-layered structure including a silicon oxide film, a silicon nitride film, a silicon oxynitride film, a silicon oxycarbide film or a silicon carbon nitride film. Alternatively, the buffer layer 120 may have a multi-layered structure including at least two of a silicon oxide film, a silicon nitride film, a silicon oxynitride film, a silicon oxycarbide film, a silicon carbon nitride film, etc.

The active pattern ACT may be disposed on the buffer layer 120. The active pattern ACT may include silicon (Si). In another example embodiment, the active pattern ACT may include a oxide semiconductor containing a binary compound (ABx), a ternary compound (ABxCy) and/or a quaternary compound (ABxCyDz). For example, the active pattern ACT may include indium (In), zinc (Zn), gallium (Ga), stannum (Sn), titanium (Ti), aluminum (Al), hafnium (Hf), zirconium (Zr) and/or magnesium (Mg).

The first insulation layer 130 may be disposed on the buffer layer 120 on which the active pattern ACT is disposed. The first insulation layer 130 may include a silicon compound, metal oxide, etc. For example, the first insulation layer 130 may be formed using silicon oxide (SiOx), silicon nitride (SiNx), silicon oxynitride (SiOxNy), aluminum oxide (AlOx), tantalum oxide (TaOx), hafnium oxide (HfOx), zirconium oxide (ZrOx), titanium oxide (TiOx), etc. These may be used alone or in a combination thereof. In addition, the first insulation layer 130 may have a single layer structure or a multi layer structure including the silicon oxide and/or the silicon nitride. In example embodiments, the first insulation layer 130 may be uniformly formed on the buffer layer 120 along a profile of the active pattern ACT. Here, the first insulation layer 130 may have a substantially small thickness, such that a stepped portion may be formed at a portion of the first insulation layer 130 adjacent to the active pattern ACT. In some example embodiments, the first insulation layer 130 may have a relatively large thickness for sufficiently covering the active pattern ACT, so that the first insulation layer 130 may have a substantially even surface.

The gate pattern GP may be disposed on the first insulation layer 130. The gate pattern GP may include metal, metal alloy, conductive metal oxide, a transparent conductive material, etc. For example, the gate pattern GP may be formed using aluminum (Al), alloy containing aluminum, aluminum nitride (AlNx), silver (Ag), alloy containing silver, tungsten (W), tungsten nitride (WNx), copper (Cu), alloy containing copper, nickel (Ni), alloy containing nickel, chrome (Cr), chrome nitride (CrNx), molybdenum (Mo), alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), etc. These may be used alone or in a combination thereof. In example embodiments, the gate pattern GP may have a single layer structure or a multi layer structure, which may include a metal film, a metal alloy film, a metal nitride film, a conductive metal oxide film and/or a transparent conductive film.

The gate pattern GP may include a gate electrode GE overlapping the active pattern ACT, a signal line to transmit driving signal for pixel, and a storage electrode.

The second insulation layer 140 may disposed on the first insulation layer 130 on which the gate pattern GP is disposed. The second insulation layer 140 may have a single-layered structure or a multi-layered structure including at least two insulation films. The second insulation layer 140 may be formed using an organic material. For example, the second insulation layer 140 may include photoresist, acryl-based resin, polyimide-based resin, polyamide-based resin, siloxane-based resin, etc. These may be used alone or in a combination thereof. Alternatively, the second insulation layer 140 may include an inorganic material. For example, the second insulation layer 140 may be formed using silicon oxide, silicon nitride, silicon oxynitride, silicon oxycarbide, aluminum oxide, titanium oxide, tantalum oxide, magnesium oxide, zinc oxide, hafnium oxide, zirconium oxide, titanium oxide, etc. These may be used alone or in a mixture thereof.

The second insulation layer 140 may have an opening corresponding to the transparent window W.

The data pattern DP may be disposed on the second insulation layer 140. The data pattern DP may include metal, metal alloy, conductive metal oxide, a transparent conductive material, etc. For example, the gate pattern GP may be formed using aluminum (Al), alloy containing aluminum, aluminum nitride (AlNx), silver (Ag), alloy containing silver, tungsten (W), tungsten nitride (WNx), copper (Cu), alloy containing copper, nickel (Ni), alloy containing nickel, chrome (Cr), chrome nitride (CrNx), molybdenum (Mo), alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), etc. These may be used alone or in a combination thereof. In example embodiments, the data pattern DP may have a single layer structure or a multi-layer structure, which may include a metal film, a metal alloy film, a metal nitride film, a conductive metal oxide film and/or a transparent conductive film.

The data pattern DP may include source electrode SE, a drain electrode DE, a signal line to transmit driving signal for pixel and a storage electrode. The source electrode SE may be electrically connected to the active pattern ACT through a contact hole formed through the first insulation layer 130 and the second insulation layer 140. The drain electrode DE may be electrically connected to the active pattern ACT through a contact hole formed through the first insulation layer 130 and the second insulation layer 140.

The active pattern ACT, the gate electrode GE, the source electrode SE and the drain electrode DE may compose the thin film transistor TFT.

The third insulation layer 150 may be disposed on the second insulation layer 140 on which the thin film transistor TFT is disposed. The third insulation layer 150 may have a single-layered structure or a multi-layered structure including at least two insulation films. The third insulation layer 150 may be formed using an organic material. For example, the third insulation layer 140 may include photoresist, acryl-based resin, polyimide-based resin, polyamide-based resin, siloxane-based resin, etc. These may be used alone or in a combination thereof. Alternatively, the third insulation layer 150 may include an inorganic material. For example, the third insulation layer 150 may be formed using silicon oxide, silicon nitride, silicon oxynitride, silicon oxycarbide, aluminum oxide, titanium oxide, tantalum oxide, magnesium oxide, zinc oxide, hafnium oxide, zirconium oxide, titanium oxide, etc. These may be used alone or in a mixture thereof.

The third insulation layer 150 may have an opening corresponding to the transparent window W.

The first electrode EL1 may be disposed on the third insulation layer 150. The first electrode EL1 may be electrically connected to the drain electrode DE through a contact hole formed through the third insulation layer 150.

The first electrode EL1 may include a reflective material or a transmissive material in accordance with the emission type of the display apparatus. For example, the first electrode EL1 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In example embodiments, the first electrode EL1 may have a single layer structure or a multi-layer structure, which may include a metal film, a metal alloy film, a metal nitride film, a conductive metal oxide film and/or a transparent conductive film.

The pixel defining layer 160 may be disposed on the third insulation layer 150 on which the first electrode EL1 is disposed. The pixel defining layer 160 may include an organic material or an inorganic material. For example, the pixel defining layer 160 may be formed using photoresist, acryl-based resin, polyacryl-based resin, polyimide-based resin, a silicon compound, etc.

The pixel defining layer 160 may define an opening corresponding to the transparent window W through which external light passes, and an opening corresponding to a pixel area in which light is emitted such as a first pixel area SP1, a second sub-pixel SP2 and a third sub-pixel SP3. The pixel defining layer 160 may overlap the first light blocking pattern 110 in a plan view. The opening which corresponds to the transparent window W may have a third length L3 in the first direction.

The light emitting structure 170 may be disposed on the first electrode EL1 exposed by the opening of the pixel defining layer 160. The light emitting structure 170 may extend on a sidewall of the opening of the pixel defining layer 160. The light emitting structure 170 may be formed by a laser induced thermal imaging process, a printing process, etc. The light emitting structure 170 may include an organic light emitting layer (EL), a hole injection layer (HIL), a hole transfer layer (HTL), an electron transfer layer (ETL), an electron injection layer (EIL), etc. In example embodiments, a plurality of organic light emitting layers may be formed using light emitting materials for generating different colors of light such as a red color of light (R), a green color of light (G) and a blue color of light (B) in accordance with color pixels of the display device. In some example embodiments, the organic light emitting layer of the of the light emitting structure 170 may include a plurality of stacked light emitting materials for generating a red color of light, a green color of light and a blue color of light to thereby emitting a white color of light.

The second electrode EL2 may be disposed on the light emitting structure 170 and the pixel defining layer 160. The second electrode EL2 may include a transmissive material or a reflective material in accordance with the emission type of the display device. For example, the second electrode EL2 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In example embodiments, the second electrode EL2 may also have a single layer structure or a multi layer structure, which may include a metal film, a metal alloy film, a metal nitride film, a conductive metal oxide film and/or a transparent conductive film.

The sealing substrate 200 may be disposed facing the base substrate 100. The sealing substrate 200 may include transparent material and be configured to prevent ambient air and moisture from permeating into the transparent organic light emitting display apparatus. The sealing substrate 200 may be combined to the base substrate 100 to seal space between the base substrate 100 and the sealing substrate 200 by a sealing agent. A desiccant or a filler may be filled into the space 180.

The second light blocking pattern 210 may be disposed on the sealing substrate 200. The second light blocking pattern 210 may include organic material or inorganic material which can block the light. For example, the second light blocking pattern 210 may be a black matrix pattern including chrome. The second light blocking pattern 210 may define an opening corresponding to the first sub-pixel SP1, a second sub-pixel SP2 and a third sub-pixel SP3 and an opening corresponding to the transparent window W. The opening corresponding to the transparent window W may have a second length L2 in the first direction.

The second length L2 and the first length L1 may be smaller than the third length L3. Thus, the opening formed through the first light blocking pattern 110 and the opening formed through the second light blocking pattern 210 may be smaller than the opening formed through the pixel defining layer 160. The opening formed through the first light blocking pattern 110 may have substantially same shape as the opening formed through the second light blocking pattern 210. In addition, in consideration with alignment error between the first substrate 100 and the second substrate 200, the opening formed through the second light blocking pattern 210 may be smaller than the opening formed through the first light blocking pattern 110. On the other hand, the opening formed through the first light blocking pattern 110 may be smaller than the opening formed through the second light blocking pattern 210.

A boundary of the pixel defining layer 160 may be covered by the second light blocking pattern 210 and the first light blocking pattern 110, so that reflection of external light passing the transparent window W by the elements of the transparent organic light emitting display apparatus may be decreased. Thus, quality of a transmitted image by the external light may be improved.

The color filter CF may be disposed on the sealing substrate 200 on which the second light blocking pattern 210 is disposed. In one example embodiment, the color filter CF may include first to third color filters. In this case, the first color filter may be a red color filter, the second color filter may be a green color filter, and the third color filter may be a blue color filter. The first to third color filters may be disposed corresponding to the first to third sub-pixels, respectively. Each of the color filters may have a color substantially same as a luminous color of corresponding light emitting structure 170. Accordingly, the display apparatus may have improved contrast. The color filter CF may be omitted depending on the light emitting portions used. For example, when the light emitting portions in the first subpixel SP1, the second subpixel SP2 and the third subpixel SP3 emit primary colors, for example, a red color, a green color and a blue color, respectively, the color filters may be omitted.

Figure 3:
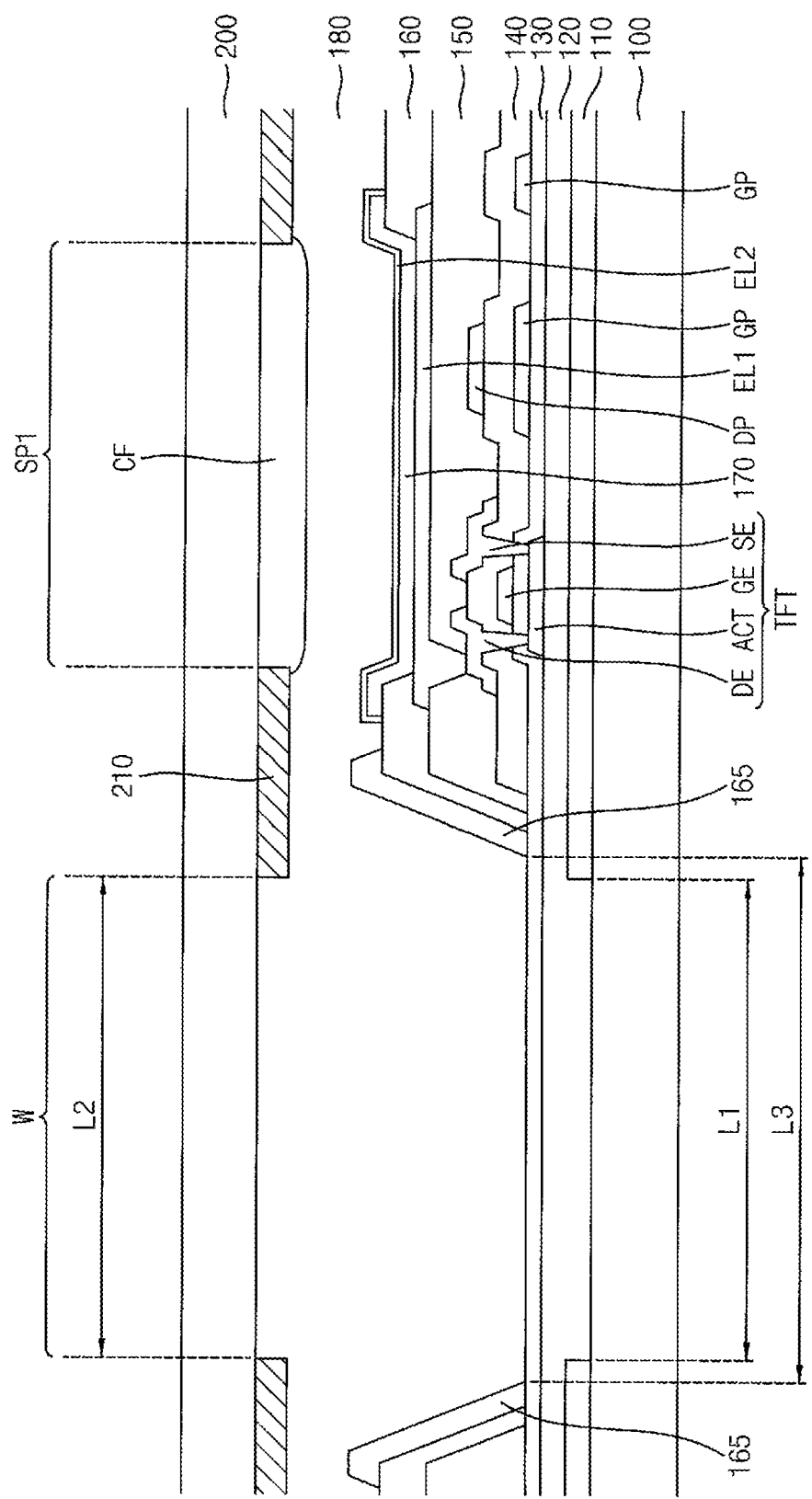
FIG. 3 is a cross-sectional view illustrating a transparent organic light emitting display apparatus according to an example embodiment of the inventive concept.

FIG. 3 is a cross-sectional view illustrating a transparent organic light emitting display apparatus according to an example embodiment of the inventive concept.

Referring to FIG. 3, the transparent organic light emitting display apparatus may be substantially same as the transparent organic light emitting display apparatus of FIG. 2, except for a first light blocking pattern and a second light blocking pattern. Thus, any further detailed descriptions concerning the same elements will be omitted.

The transparent organic light emitting display apparatus may include a base substrate 100, a first light blocking pattern 110, a buffer layer 120, a thin film transistor TFT, a first insulation layer 130, a gate pattern GP, a second insulation layer 140, a data pattern DP, a third insulation layer 150, a first electrode EL1, a pixel defining layer 160, a third light blocking pattern 165, a light emitting structure 170, a second electrode EL2, a sealing substrate 200, a second light blocking layer 210, and a color filter CF.

The base substrate 100 may include a transparent insulation substrate.

The first light blocking pattern 110 may be disposed on the base substrate 100. The first light blocking pattern 110 may block light. The first light blocking pattern 110 may include organic material or inorganic material which can block the light. For example, the first light blocking pattern 110 may be a black matrix pattern including chrome.

The first light blocking pattern 110 may define an opening corresponding to a transparent window W. The opening may have a first length L1 in a first direction. The first light blocking pattern 110 may be formed to cover an area of the TFT, the gate pattern GP, the data pattern DP and the light emitting pattern 170 in a plan view which may be disposed on the first light blocking pattern 110.

The buffer layer 120 may be disposed on the base substrate 100 on which the first light blocking pattern 110 is disposed.

The active pattern ACT may be disposed on the buffer layer 120.

The first insulation layer 130 may be disposed on the buffer layer 120 on which the active pattern ACT is disposed.

The gate pattern GP may be disposed on the first insulation layer 130. The gate pattern GP may include a gate electrode GE overlapping the active pattern ACT, a signal line to transmit driving signal for pixel, and a storage electrode.

The second insulation layer 140 may disposed on the first insulation layer 130 on which the gate pattern GP is disposed.

The data pattern DP may be disposed on the second insulation layer 140. The data pattern DP may include source electrode SE, a drain electrode DE, a signal line to transmit driving signal for pixel and a storage electrode.

The active pattern ACT, the gate electrode GE, the source electrode SE and the drain electrode DE may compose the thin film transistor TFT.

The third insulation layer 150 may be disposed on the second insulation layer 140 on which the thin film transistor TFT is disposed.

The first electrode EL1 may be disposed on the third insulation layer 150. The first electrode EL1 may be electrically connected to the drain electrode DE through a contact hole formed through the third insulation layer 150.

The pixel defining layer 160 may be disposed on the third insulation layer 150 on which the first electrode EL1 is disposed. The pixel defining layer 160 may include an organic material or an inorganic material. For example, the pixel defining layer 160 may be formed using photoresist, acryl-based resin, polyacryl-based resin, polyimide-based resin, a silicon compound, etc.

The pixel defining layer 160 may define an opening corresponding to the transparent window W through which external light passes, and an opening corresponding to a pixel area in which light is emitted such as a first pixel area SP1, a second sub-pixel SP2 and a third sub-pixel SP3. The pixel defining layer 160 may overlap the first light blocking pattern 110.

The third light blocking pattern 165 may be disposed on boundary side surfaces of the opening of the pixel defining layer 160 which corresponds to the transparent window W. Thus, a side surface of the pixel defining layer 160 may be covered by the third light blocking pattern 165. The third light blocking pattern 165 may include organic material or inorganic material which can block the light. For example, the third light blocking pattern 165 may be a black matrix pattern including chrome.

The third light blocking pattern 165 may define an opening corresponding to the transparent window W. The opening may have a third length L3 in the first direction.

The light emitting structure 170 may be disposed on the first electrode EL1 exposed by the opening of the pixel defining layer 160. The light emitting structure 170 may extend on a sidewall of the opening of the pixel defining layer 160. The light emitting structure 70 may be formed by a laser induced thermal imaging process, a printing process, etc. The light emitting structure 170 may include an organic light emitting layer (EL), a hole injection layer (HIL), a hole transfer layer (HTL), an electron transfer layer (ETL), an electron injection layer (EIL), etc. In example embodiments, a plurality of organic light emitting layers may be formed using light emitting materials for generating different colors of light such as a red color of light (R), a green color of light (G) and a blue color of light (B) in accordance with color pixels of the display device. In some example embodiments, the organic light emitting layer of the of the light emitting structure 170 may include a plurality of stacked light emitting materials for generating a red color of light, a green color of light and a blue color of light to thereby emitting a white color of light.

The light emitting structure 170 may be spaced apart from the third light blocking pattern 165. Thus, the light emitting structure 170 may not be directly contact the third light blocking pattern 165

The second electrode EL2 may be disposed on the light emitting structure 170 and the pixel defining layer 160.

The sealing substrate 200 may be disposed facing the base substrate 100. The sealing substrate 200 may be combined to the base substrate 100 to seal space between the base substrate 100 and the sealing substrate 200 by a sealing agent. A desiccant or a filler may be filled into the space 180.

The second light blocking pattern 210 may be disposed on the sealing substrate 200.

The second light blocking pattern 210 may include organic material or inorganic material which can block the light. For example, the second light blocking pattern 210 may be a black matrix pattern including chrome. The second light blocking pattern 210 may define an opening corresponding to the first sub-pixel SP1, a second sub-pixel SP2 and a third sub-pixel SP3 and an opening corresponding to the transparent window W. The opening corresponding to the transparent window W may have a second length L2 in the first direction.

The second length L2 and the first length L1 may be smaller than the third length L3. Thus, the opening formed through the first light blocking pattern 110 and the opening formed through the second light blocking pattern 210 may be smaller than the opening of the third light blocking pattern 165. The opening formed through the first light blocking pattern 110 may have substantially same shape as the opening formed through the second light blocking pattern 210. In addition, in consideration with alignment error between the first substrate 100 and the second substrate 200, the opening formed through the second light blocking pattern 210 may be smaller than the opening formed through the first light blocking pattern 110. On the other hand, the opening formed through the first light blocking pattern 110 may be smaller than the opening formed through the second light blocking pattern 210.

A boundary of the pixel defining layer 160 may be covered by the second light blocking pattern 210 and the first light blocking pattern 110, and the third light blocking pattern 165 is formed on the boundary side surfaces of the opening of the pixel defining layer 160, so that reflection of external light passing the transparent window W by the elements of the transparent organic light emitting display apparatus may be decreased. Thus, quality of a transmitted image by the external light may be improved.

The color filter CF may be disposed on the sealing substrate 200 on which the second light blocking pattern 210 is disposed. The color filter CF may be omitted depending on the light emitting portions used. For example, when the light emitting portions in the first subpixel SP1, the second subpixel SP2 and the third subpixel SP3 emit primary colors, for example, a red color, a green color and a blue color, respectively, the color filters may be omitted.

Figure 4:
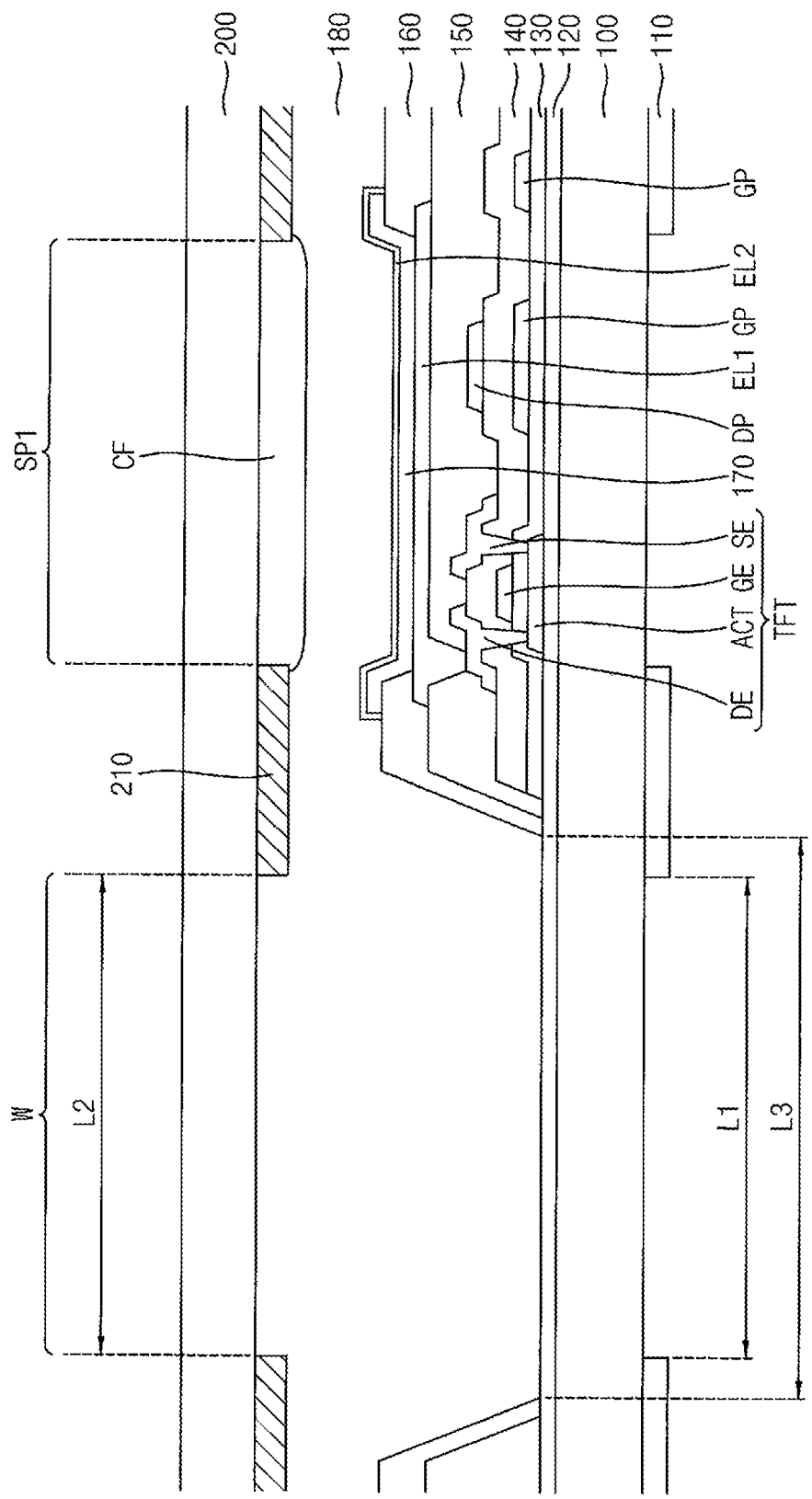
FIG. 4 is a cross-sectional view illustrating a transparent organic light emitting display apparatus according to an example embodiment of the inventive concept.

FIG. 4 is a cross-sectional view illustrating a transparent organic light emitting display apparatus according to an example embodiment of the inventive concept.

Referring to FIG. 4, the transparent organic light emitting display apparatus may be substantially same as the transparent organic light emitting display apparatus of FIG. 2, except for a first light blocking pattern and a first insulation layer. Thus, any further detailed descriptions concerning the same elements will be omitted.

The transparent organic light emitting display apparatus may include a base substrate 100, a first light blocking pattern 110, a buffer layer 120, a thin film transistor TFT, a first insulation layer 130, a gate pattern GP, a second insulation layer 140, a data pattern DP, a third insulation layer 150, a first electrode EL1, a pixel defining layer 160, a light emitting structure 170, a second electrode EL2, a sealing substrate 200, a second light blocking layer 210, and a color filter CF.

The base substrate 100 may include a transparent insulation substrate.

The first light blocking pattern 110 may be disposed on a bottom surface of the base substrate 100. The first light blocking pattern 110 may block light. The first light blocking pattern 110 may include organic material or inorganic material which can block the light. For example, the first light blocking pattern 110 may be a black matrix pattern including chrome.

The first light blocking pattern 110 may define an opening corresponding to a transparent window W. The opening may have a first length L1 in a first direction.

The buffer layer 120 may be disposed on a top surface of the base substrate 100. The top surface of the base substrate 100 is opposite to the bottom surface of the base substrate 100. Thus, the first light blocking pattern 110 may be disposed on an outer surface of the transparent organic light emitting display apparatus The active pattern ACT may be disposed on the buffer layer 120.

The first insulation layer 130 may be disposed on the buffer layer 120 on which the active pattern ACT is disposed. The first insulation layer 130 may define an opening corresponding to the transparent window W.

The first insulation layer 130 may be disposed on the buffer layer 120 on which the active pattern ACT is disposed. The first insulation layer 130 may include a silicon compound, metal oxide, etc. For example, the first insulation layer 130 may be formed using silicon oxide (SiOx), silicon nitride (SiNx), silicon oxynitride (SiOxNy), aluminum oxide (AlOx), tantalum oxide (TaOx), hafnium oxide (HfOx), zirconium oxide (ZrOx), titanium oxide (TiOx), etc. These may be used alone or in a combination thereof. In addition, the first insulation layer 130 may have a single layer structure or a multi layer structure including the silicon oxide and/or the silicon nitride. In example embodiments, the first insulation layer 130 may be uniformly formed on the buffer layer 120 along a profile of the active pattern ACT. Here, the first insulation layer 130 may have a substantially small thickness, such that a stepped portion may be formed at a portion of the first insulation layer 130 adjacent to the active pattern ACT. In some example embodiments, the first insulation layer 130 may have a relatively large thickness for sufficiently covering the active pattern ACT, so that the first insulation layer 130 may have a substantially level surface.

The gate pattern GP may be disposed on the first insulation layer 130. The gate pattern GP may include a gate electrode GE overlapping the active pattern ACT, a signal line to transmit driving signal for pixel, and a storage electrode.

The second insulation layer 140 may disposed on the first insulation layer 130 on which the gate pattern GP is disposed. The second insulation layer 140 may define an opening corresponding to the transparent window W. The second insulation layer 140 may have substantially same shape as that of the first insulation layer 130 in a plan view.

The data pattern DP may be disposed on the second insulation layer 140. The data pattern DP may include source electrode SE, a drain electrode DE, a signal line to transmit driving signal for pixel and a storage electrode.

The active pattern ACT, the gate electrode GE, the source electrode SE and the drain electrode DE may compose the thin film transistor TFT.

The third insulation layer 150 may be disposed on the second insulation layer 140 on which the thin film transistor TFT is disposed. The third insulation layer 150 may define an opening corresponding to the transparent window W.

The first electrode EL1 may be disposed on the third insulation layer 150.

The pixel defining layer 160 may be disposed on the third insulation layer 150 on which the first electrode EL1 is disposed.

The pixel defining layer 160 may define an opening corresponding to the transparent window W through which external light passes. The pixel defining layer 160 may overlap the first light blocking pattern 110. The opening corresponding to the transparent window W may have a third length L3 in the first direction.

The light emitting structure 170 may be disposed on the first electrode EL1 exposed by the opening of the pixel defining layer 160.

The second electrode EL2 may be disposed on the light emitting structure 170 and the pixel defining layer 160.

The sealing substrate 200 may be disposed facing the base substrate 100. The sealing substrate 200 may be combined to the base substrate 100 to seal space between the base substrate 100 and the sealing substrate 200 by a sealing agent. A desiccant or a filler may be filled into the space 180.

The second light blocking pattern 210 may be disposed on the sealing substrate 200.

The second light blocking pattern 210 may include organic material or inorganic material which can block the light. For example, the second light blocking pattern 210 may be a black matrix pattern including chrome. The second light blocking pattern 210 may define an opening corresponding to the first sub-pixel SP1, a second sub-pixel SP2 and a third sub-pixel SP3 and an opening corresponding to the transparent window W. The opening corresponding to the transparent window W may have a second length L2 in the first direction.

The second length L2 and the first length L1 may be smaller than the third length L3. Thus, the opening formed through the first light blocking pattern 110 and the opening formed through the second light blocking pattern 210 may be smaller than the opening formed through the pixel defining layer 160. The opening formed through the first light blocking pattern 110 may have substantially same shape as the opening formed through the second light blocking pattern 210. In addition, in consideration with alignment error between the first substrate 100 and the second substrate 200, the opening formed through the second light blocking pattern 210 may be smaller than the opening formed through the first light blocking pattern 110. On the other hand, the opening formed through the first light blocking pattern 110 may be smaller than the opening formed through the second light blocking pattern 210.

A boundary of the pixel defining layer 160 may be covered by the second light blocking pattern 210 and the first light blocking pattern 110, so that reflection of external light passing the transparent window W by the elements of the transparent organic light emitting display apparatus may be decreased. Thus, quality of a transmitted image by the external light may be improved.

The color filter CF may be disposed on the sealing substrate 200 on which the second light blocking pattern 210 is disposed. The color filter CF may be omitted depending on the light emitting portions used. For example, when the light emitting portions in the first subpixel SP1, the second subpixel SP2 and the third subpixel SP3 emit primary colors, for example, a red color, a green color and a blue color, respectively, the color filters may be omitted.

Figure 5:
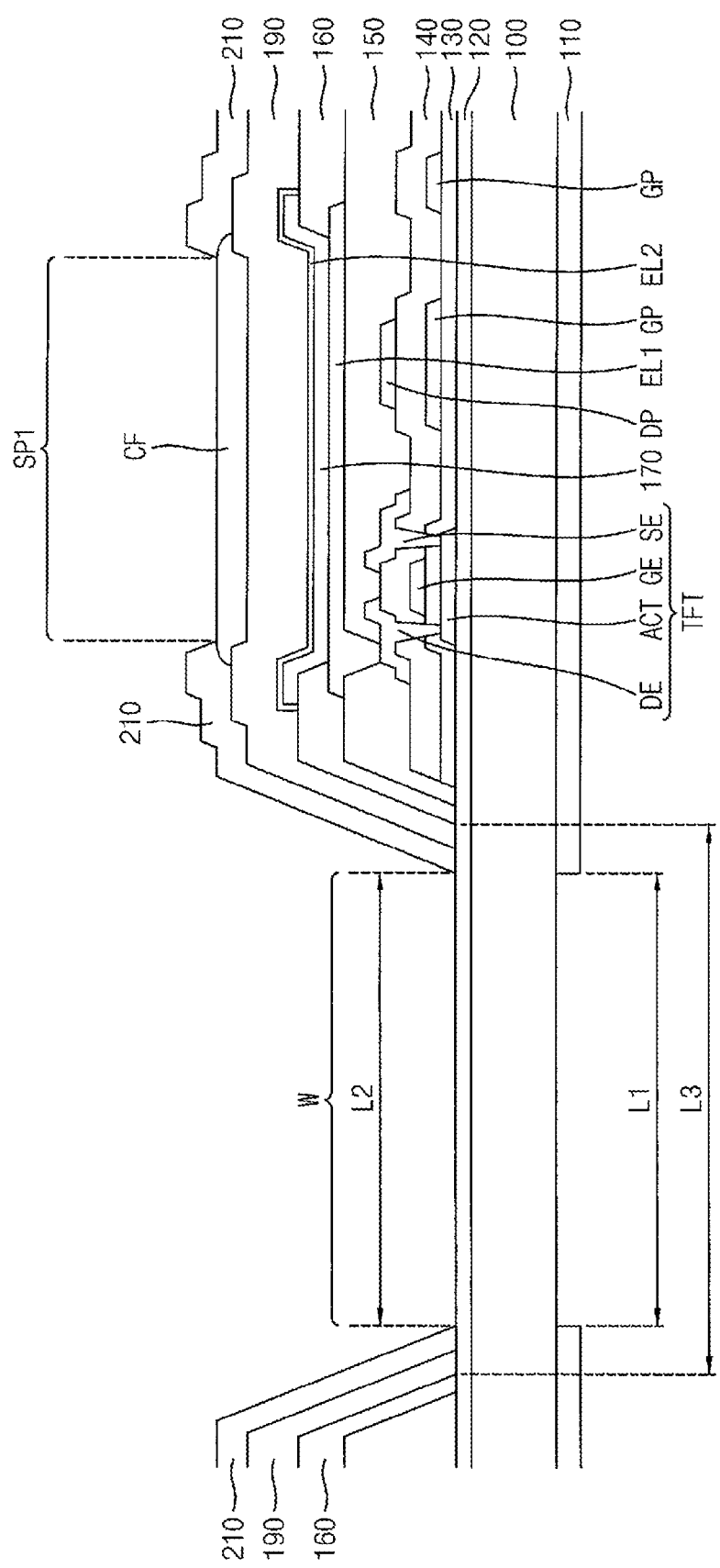
FIG. 5 is a cross-sectional view illustrating a transparent organic light emitting display apparatus according to an example embodiment of the inventive concept.

FIG. 5 is a cross-sectional view illustrating a transparent organic light emitting display apparatus according to an example embodiment of the inventive concept.

Referring to FIG. 5, the transparent organic light emitting display apparatus may be substantially same as the transparent organic light emitting display apparatus of FIG. 2, except for a thin film encapsulation layer, a second light blocking pattern and a color filter. Thus, any further detailed descriptions concerning the same elements will be omitted.

The transparent organic light emitting display apparatus may include a base substrate 100, a first light blocking pattern 110, a buffer layer 120, a thin film transistor TFT, a first insulation layer 130, a gate pattern GP, a second insulation layer 140, a data pattern DP, a third insulation layer 150, a first electrode EL1, a pixel defining layer 160, a light emitting structure 170, a second electrode EL2, a thin film encapsulation (TFE) layer 190, a color filter CF and a second light blocking layer 210.

The base substrate 100 may include a transparent insulation substrate.

The first light blocking pattern 110 may be disposed on a bottom surface of the base substrate 100. The first light blocking pattern 110 may define an opening corresponding to a transparent window W. The opening may have a first length L1 in a first direction. The first light blocking pattern 110 may be formed to cover an area of the TFT, the gate pattern GP, the data pattern DP and the light emitting pattern 170 in a plan view which may be disposed on the first light blocking pattern 110.

The buffer layer 120 may be disposed on a top surface of the base substrate 100.

The active pattern ACT may be disposed on the buffer layer 120.

The first insulation layer 130 may be disposed on the buffer layer 120 on which the active pattern ACT is disposed. The first insulation layer 130 may define an opening corresponding to the transparent window W.

The gate pattern GP may be disposed on the first insulation layer 130. The gate pattern GP may include a gate electrode GE overlapping the active pattern ACT, a signal line to transmit driving signal for pixel, and a storage electrode.

The second insulation layer 140 may disposed on the first insulation layer 130 on which the gate pattern GP is disposed. The second insulation layer 140 may define an opening corresponding to the transparent window W. The second insulation layer 140 may have substantially same shape as that of the first insulation layer 130 in a plan view.

The data pattern DP may be disposed on the second insulation layer 140. The data pattern DP may include source electrode SE, a drain electrode DE, a signal line to transmit driving signal for pixel and a storage electrode.

The active pattern ACT, the gate electrode GE, the source electrode SE and the drain electrode DE may compose the thin film transistor TFT.

The third insulation layer 150 may be disposed on the second insulation layer 140 on which the thin film transistor TFT is disposed. The third insulation layer 150 may define an opening corresponding to the transparent window W.

The first electrode EL1 may be disposed on the third insulation layer 150.

The pixel defining layer 160 may be disposed on the third insulation layer 150 on which the first electrode EL1 is disposed.

The pixel defining layer 160 may define an opening corresponding to the transparent window W through which external light passes. The pixel defining layer 160 may overlap the first light blocking pattern 110. The opening corresponding to the transparent window W may have a third length L3 in the first direction.

The light emitting structure 170 may be disposed on the first electrode EL1 exposed by the opening of the pixel defining layer 160.

The second electrode EL2 may be disposed on the light emitting structure 170 and the pixel defining layer 160.

The TFE layer 190 may be disposed on the buffer layer 120, the pixel defining layer 160 and the second electrode EL2. The TFE layer 190 may define an opening corresponding to the transparent window W. In one example embodiment, the TFE layer 190 may entirely cover the base substrate 100.

The TFE layer 190 may protect the second electrode EL2 and the light emitting structure 170 by preventing ambient air and moisture from permeating into the transparent organic light emitting display apparatus. The TFE layer 190 may include an inorganic film such as silicon oxide or silicon nitride film and an organic film such as epoxy or polyimide film which are alternately and repeatedly disposed. However, example embodiments of TFE layer 190 may be not limited thereto, any structure of transparent thin film for sealing may be applied.

The color filter CF may be disposed on the TFE layer 190 on which the second light blocking pattern 210 is disposed. In one example embodiment, the color filter CF may include first to third color filters. In this case, the first color filter may be a red color filter, the second color filter may be a green color filter, and the third color filter may be a blue color filter. The first to third color filters may be disposed corresponding to the first to third sub-pixels, respectively. Each of the color filters may have a color substantially same as a luminous color of corresponding light emitting structure 170. Accordingly, the display apparatus may have improved contrast. The color filters CFs may be omitted depending on the light emitting portions used. For example, when the light emitting portions in the first subpixel SP1, the second subpixel SP2 and the third subpixel SP3 emit primary colors, for example, a red color, a green color and a blue color, respectively, the color filters may be omitted.

The second light blocking pattern 210 may be disposed on the buffer layer 120, the TFE layer 190 and the color filter CF. The second light blocking pattern 210 may include organic material or inorganic material which can block the light. For example, the second light blocking pattern 210 may be a black matrix pattern including chrome. The second light blocking pattern 210 may define an opening corresponding to the first sub-pixel SP1, a second sub-pixel SP2 and a third sub-pixel SP3 and an opening corresponding to the transparent window W. The opening corresponding to the transparent window W may have a second length L2 in the first direction.

The second length L2 and the first length L1 may be smaller than the third length L3. Thus, the opening formed through the first light blocking pattern 110 and the opening formed through the second light blocking pattern 210 may be smaller than the opening formed through the pixel defining layer 160. The opening formed through the first light blocking pattern 110 may have substantially same shape as the opening formed through the second light blocking pattern 210. In addition, in consideration with alignment error between the first substrate 100 and the second substrate 200, the opening formed through the second light blocking pattern 210 may be smaller than the opening formed through the first light blocking pattern 110. On the other hand, the opening formed through the first light blocking pattern 110 may be smaller than the opening formed through the second light blocking pattern 210.

A boundary of the pixel defining layer 160 may be covered by the second light blocking pattern 210 and the first light blocking pattern 110, so that reflection of external light passing the transparent window W by the elements of the transparent organic light emitting display apparatus may be decreased. Thus, quality of a transmitted image by the external light may be improved.

FIGS. 6A to 6J are cross-sectional views illustrating a method of manufacturing the transparent organic light emitting display apparatus of FIG. 2.

Figure 6A:
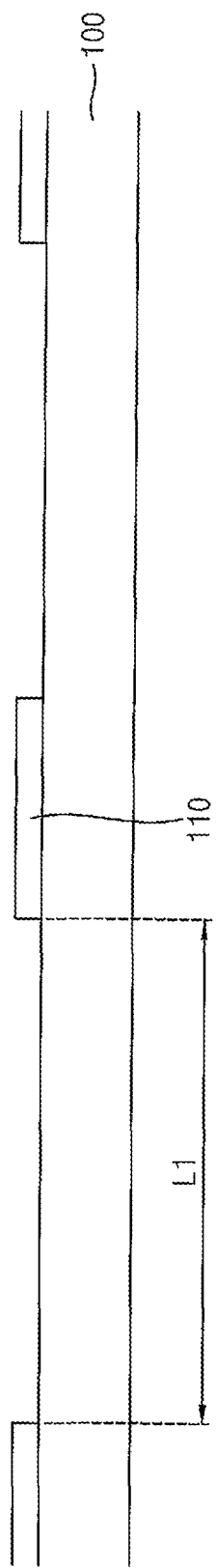

Referring to FIG. 6A, a first light blocking layer 110 may be formed on a base substrate 100.

The base substrate 100 may include a transparent insulation substrate. For example, the base substrate 100 may include a glass substrate, a quartz substrate, a transparent resin substrate, etc. Examples of the transparent resin substrate for the base substrate 10 may include polyimide-based resin, acryl-based resin, polyacrylate-based resin, polycarbonate-based resin, polyether-based resin, sulfonic acid containing resin, polyethyleneterephthalate-based resin, etc.

The first light blocking pattern 110 may include material which can block light. The first light blocking pattern 110 may include organic material or inorganic material which can block light. For example, the first light blocking pattern 110 may be a black matrix pattern including chrome.

The first light blocking pattern 110 may define an opening corresponding to a transparent window (refers to W of FIG. 6J). The opening may have a first length L1 in a first direction. In addition, the first light blocking pattern 110 may form an opening corresponding to a first sub-pixel (refers to SP1 of FIG. 6J).

Figure 6B:
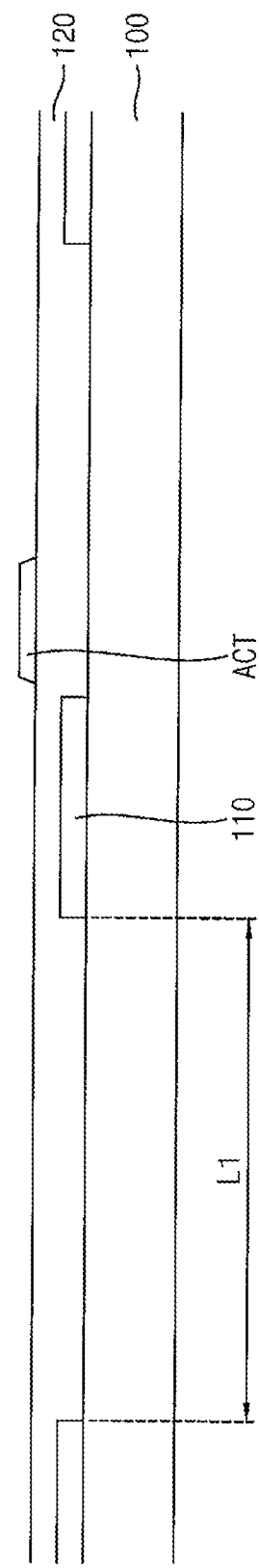

Referring to FIG. 6B, a buffer layer 120 may be formed on the base substrate 100 on which the first light blocking pattern 110 is formed. The buffer layer 120 may be formed by a spin coating process, a chemical vapor deposition (CVD) process, a plasma enhanced chemical vapor deposition (PECVD) process, a high density plasma-chemical vapor deposition (HDP-CVD) process, a printing process, etc.

And then, an active pattern ACT may be formed on the buffer layer 120.

A semiconductor layer (not illustrated) may be formed on the buffer layer 120, and then a preliminary active layer (not illustrated) may be formed on the buffer layer 120 by patterning the semiconductor layer. The crystallization process may be performed to crystallize the preliminary active layer to form the active pattern ACT on the buffer layer 120. Here, the semiconductor layer may be formed by a CVD process, a PECVD process, a low pressure chemical vapor deposition (LPCVD) process, a sputtering process, a printing process, etc. When the semiconductor layer includes amorphous silicon, the active pattern ACT may include polysilicon. The crystallization process for forming the active pattern ACT may include a laser irradiation process, a thermal treatment process, a thermal process utilizing a catalyst, etc. In some example embodiments, a dehydrogenation process may be performed about the semiconductor layer and/or the preliminary active layer after forming the semiconductor layer and/or the preliminary active layer on the buffer layer 120. The dehydrogenation process may reduce the hydrogen concentration of the semiconductor layer and/or the preliminary active layer, so that the active pattern ACT may have improved electrical characteristics.

Figure 6C:
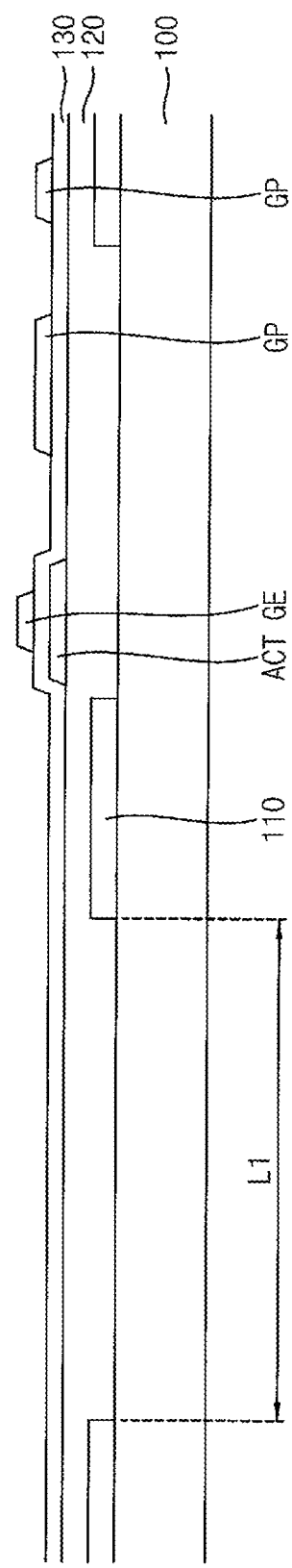

Referring to FIG. 6C, a first insulation layer 130 may be formed on the buffer layer 120 on which the active pattern ACT is formed.

The first insulation layer 130 may be formed by a CVD process, a spin coating process, a PECVD process, a sputtering process, a vacuum evaporation process, an HDP-CVD process, a printing process, etc.

And then, a gate pattern GP may be formed on the first insulation layer 130. In example embodiments, a conductive layer (not illustrated) may be formed on the first insulation layer 130, and then the conductive layer may be patterned by a photolithography process. Hence, the gate pattern GP may be provided on the first insulation layer 130. The conductive layer may be formed by a printing process, a sputtering process, a CVD process, a pulsed laser deposition (PLD) process, a vacuum evaporation process, an atomic layer deposition (ALD) process, etc. When the conductive layer is formed by a printing process, the photolithography process may be omitted.

The gate pattern GP may include a gate electrode GE overlapping the active pattern ACT, a signal line to transmit driving signal for pixel, and a storage electrode.

Figure 6D:
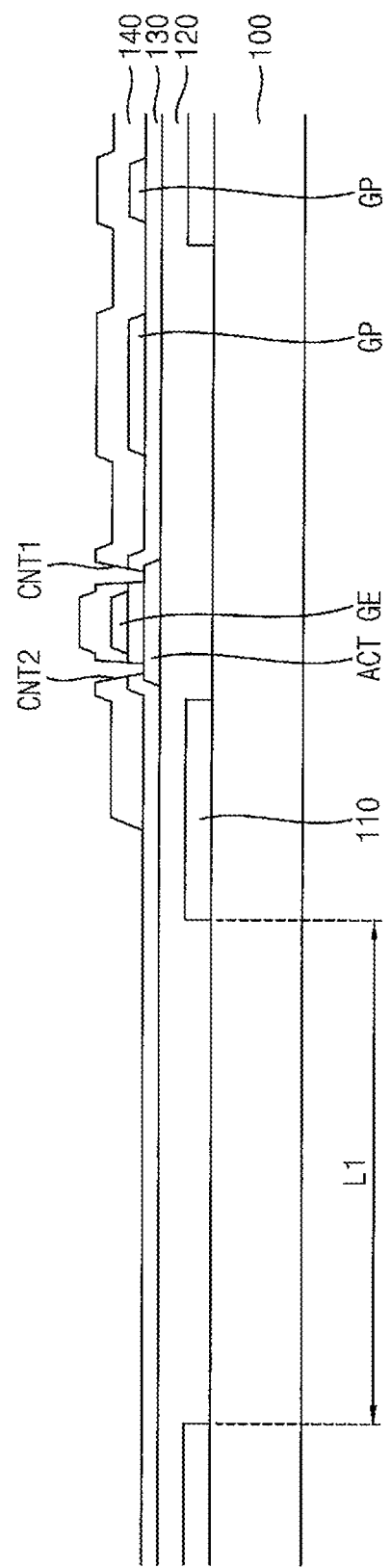

Referring to FIG. 6D, a second insulation layer 140 may be formed on the first insulation layer 130 on which the gate pattern GP is formed. The second insulation layer 140 may be formed by a CVD process, a spin coating process, a PECVD process, a sputtering process, a vacuum evaporation process, an HDP-CVD process, a printing process, etc.

A first contact hole CNT1 and a second contact hole CNT2 exposing the active pattern ACT may be formed by partially etching the second insulation layer 140 and the first insulation layer 130. The first contact hole CNT1 may expose a portion of the active pattern ACT. For example, the first contact hole CNT1 may expose a source area of the active pattern. The second contact hole CNT2 may expose a portion of the active pattern ACT. For example, the second contact hole CNT2 may expose a drain area of the active pattern.

In addition, the second insulation layer 140 may have an opening corresponding to the transparent window W.

Referring to FIG. 6E, a data pattern DP may be formed on the second insulation layer 140. In example embodiments, a conductive layer (not illustrated) may be formed on the second insulation layer 140, and then the conductive layer may be patterned by a photolithography process. Hence, the data pattern DP may be provided on the second insulation layer 140. The conductive layer may be formed by a printing process, a sputtering process, a CVD process, a PLD process, a vacuum evaporation process, an ALD process, etc. When the conductive layer is formed by a printing process, the photolithography process may be omitted.

The data pattern DP may include source electrode SE, a drain electrode DE, a signal line to transmit driving signal for pixel and a storage electrode. The source electrode SE may be electrically connected to the active pattern ACT through the first contact hole CNT1. The drain electrode DE may be electrically connected to the active pattern ACT through the second contact hole CNT2.

The active pattern ACT, the gate electrode GE, the source electrode SE and the drain electrode DE may compose the thin film transistor TFT.

Figure 6F:
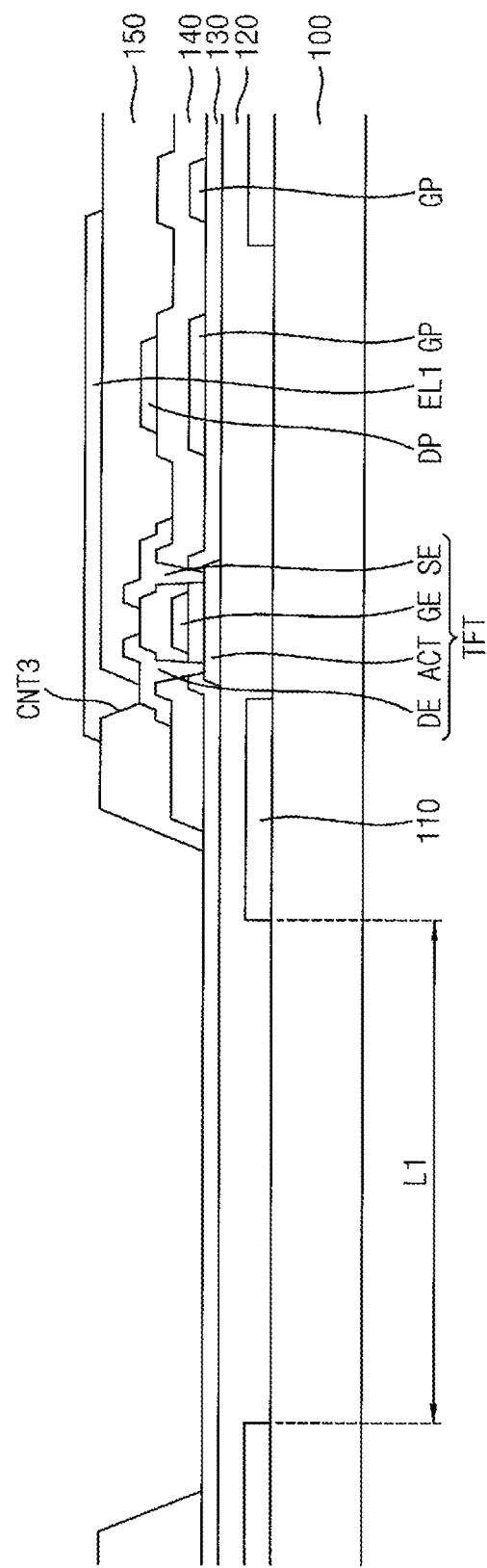

Referring to FIG. 6F, a third insulation layer 150 may be formed on the second insulation layer 140 on which the thin film transistor TFT is formed. In example embodiments, a planarization process may be executed on the third insulation layer 150 to enhance the flatness of the third insulation layer 150. For example, the third insulation layer 150 may have a substantially even surface by a chemical mechanical polishing (CMP) process, an etch-back process, etc. The third insulation layer 50 may be formed using an organic material.

The third insulation layer 150 may be obtained by a spin coating process, a printing process, a sputtering process, a CVD process, an ALD process, a PECVD process, an HDP-CVD process or a vacuum evaporation process in accordance with ingredients included in the third insulation layer 150.

A third contact hole CNT3 may be formed by partially etching the third insulation layer 150 to expose the drain electrode DE.

In addition, the third insulation layer 150 may have an opening corresponding to the transparent window W.

And then, a first electrode EL1 may be formed on the third insulation layer 150. In example embodiments, a conductive layer (not illustrated) may be formed on the third insulation layer 150, and then the conductive layer may be patterned by a photolithography process. Hence, the first electrode EL1 may be provided on the third insulation layer 150. The conductive layer may be formed by a printing process, a sputtering process, a CVD process, a PLD process, a vacuum evaporation process, an ALD process, etc. When the conductive layer is formed by a printing process, the photolithography process may be omitted.

The first electrode EL1 may be electrically connected to the drain electrode DE through the third contact hole CNT3.

Figure 6G:
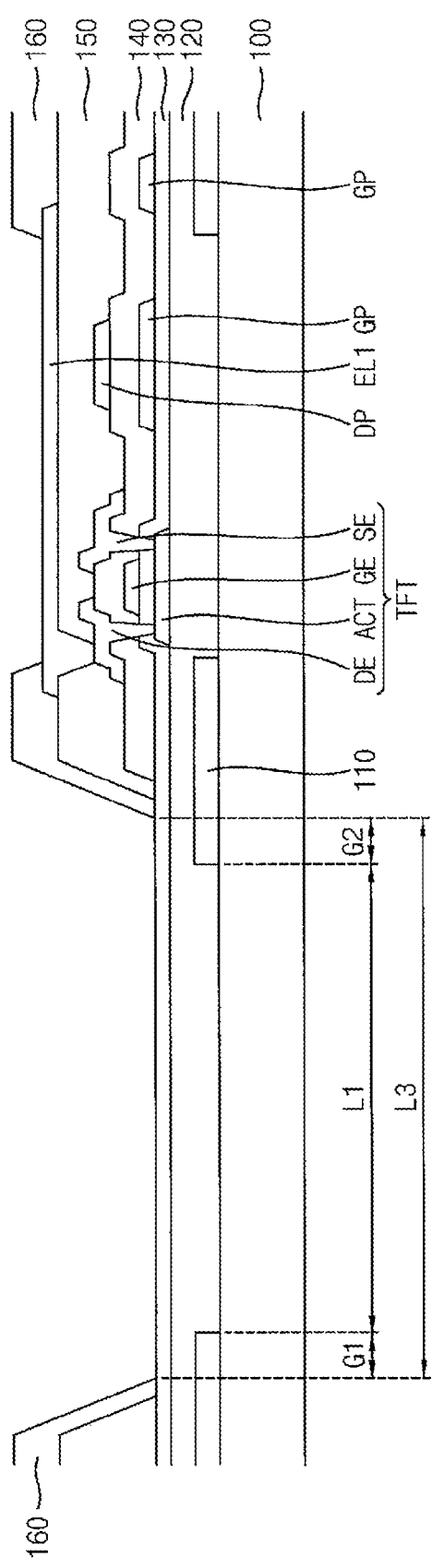

Referring to FIG. 6G a pixel defining layer 160 may be formed on the third insulation layer 150 on which the first electrode EL1 is formed.

The pixel defining layer 160 may be obtained by a spin coating process, a spray process, a printing process, a CVD process, etc.

The pixel defining layer 160 may define an opening corresponding to the transparent window W through which external light passes, and an opening corresponding to a pixel area in which light is emitted such as a first pixel area SP1, a second sub-pixel SP2 and a third sub-pixel SP3. The opening which corresponds to the transparent window W may have a third length L3 in the first direction.

The first length L1 may be smaller than the third length L3 by a first gap G1 and a second gap G2. Thus, the third length L3 may be longer than the first length L1 by the first gap G1 and the second gap G2 in both sides. The first gap G1 may be substantially same as the second gap G2. Each of the first gap G1 and the second gap G2 may be about 1 um to about 5 μm.

Figure 6H:
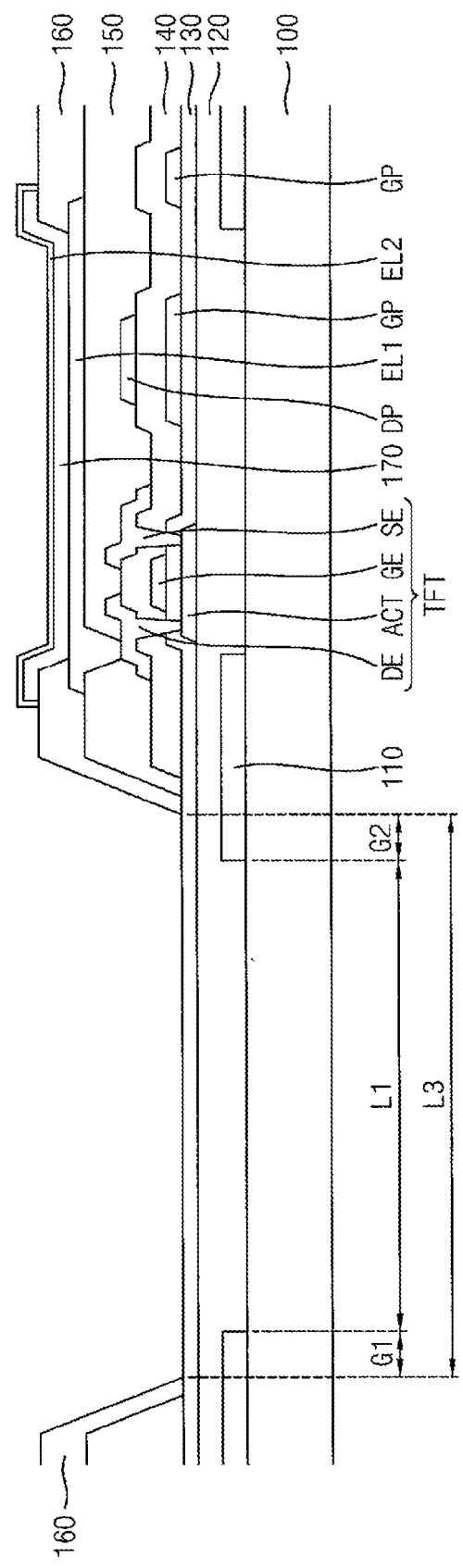

Referring to FIG. 6H, a light emitting structure 170 is formed on the first electrode EL1 exposed by the opening of the pixel defining layer 160. The light emitting structure 170 may be formed by a laser induced thermal imaging process, a printing process, etc.

The second electrode EL2 may be formed on the light emitting structure 170 and the pixel defining layer 160. The second electrode EL2 may be formed by a printing process, a sputtering process, a CVD process, a PLD process, a vacuum evaporation process, an ALD process, etc.

Referring to FIG. 6I, a sealing substrate 200 may be provided. The sealing substrate 200 may include transparent material and be configured to prevent ambient air and moisture from permeating into the transparent organic light emitting display apparatus. For example, the sealing substrate 200 may include a glass substrate, a quartz substrate, a transparent resin substrate, etc. Examples of the transparent resin substrate for the sealing substrate 200 may include polyimide-based resin, acryl-based resin, polyacrylate-based resin, polycarbonate-based resin, polyether-based resin, sulfonic acid containing resin, polyethyleneterephthalate-based resin, etc.

A second light blocking pattern 210 may be formed on the sealing substrate 200. The second light blocking pattern 210 may include organic material or inorganic material which can block light. For example, the second light blocking pattern 210 may be a black matrix pattern including chrome. The second light blocking pattern 210 may define an opening corresponding to the first sub-pixel SP1, a second sub-pixel SP2 and a third sub-pixel SP3 and an opening corresponding to the transparent window W. The opening corresponding to the transparent window W may have a second length L2 in the first direction.

A color filter CF may be formed on the sealing substrate 200 on which the second light blocking pattern 210 is disposed. In one example embodiment, the color filter CF may include first to third color filters. In this case, the first color filter may be a red color filter, the second color filter may be a green color filter, and the third color filter may be a blue color filter. The first to third color filters may be disposed corresponding to the first to third sub-pixels, respectively. Each of the color filters may have a color substantially same as a luminous color of corresponding light emitting structure 170. Accordingly, the display apparatus may have improved contrast.

Referring to FIG. 6J, the sealing substrate 200 on which the color filter CF is formed may be combined to the base substrate 100 on which the second electrode EL2 is formed to seal space between the base substrate 100 and the sealing substrate 200 by a sealing agent. A desiccant or a filler may be filled into the space 180.

FIGS. 7A to 7E are cross-sectional views illustrating a method of manufacturing the transparent organic light emitting display apparatus of FIG. 3.

Referring to FIG. 7A, a first light blocking pattern 110 may be formed on the base substrate 100. The first light blocking pattern 110 may define an opening corresponding to a transparent window (refers to W of FIG. 6J). The opening may have a first length L1 in a first direction.

Figure 7B:
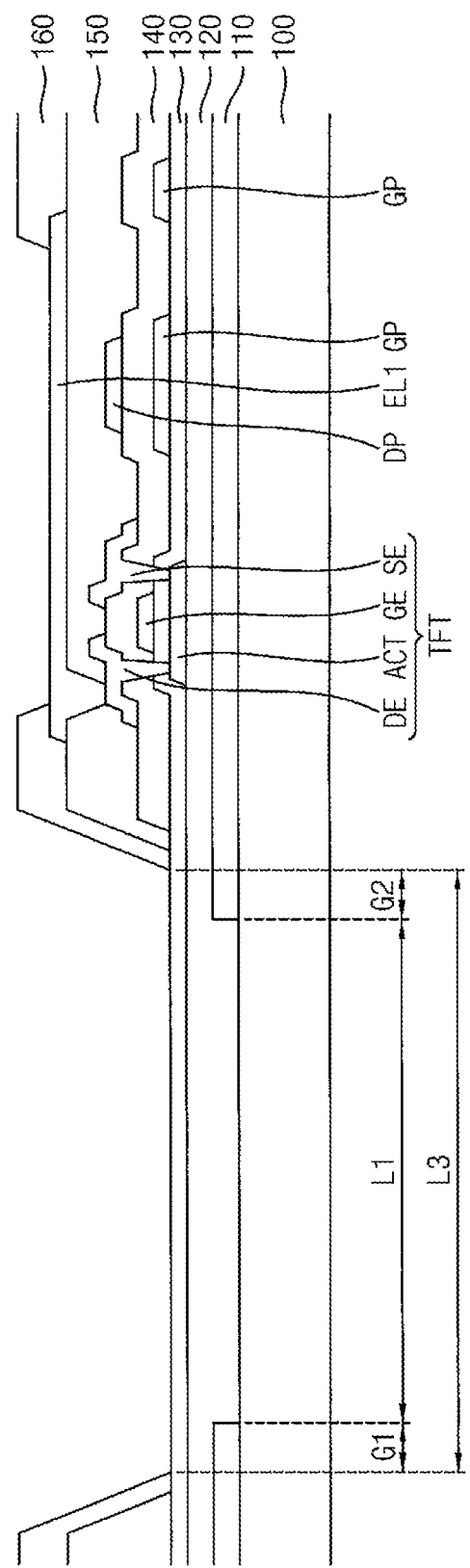

Referring to FIG. 7B, a buffer layer 120 may be formed on the base substrate 100 on which the first light blocking pattern 110 is formed. An active pattern ACT may be formed on the buffer layer 120. A first insulation layer 130 may be formed on the buffer layer 120 on which the active pattern ACT is formed. A gate pattern GP including a gate electrode GE may be formed on the first insulation layer 130. A second insulation layer 140 may be formed on the first insulation layer 130 on which the gate pattern GP is formed. Contact holes exposing the active pattern ACT may be formed by partially etching the second insulation layer 140 and the first insulation layer 130.

And then, a data pattern DP having a source electrode SE and a drain electrode DE may be formed on the insulation layer 140. The active pattern ACT, the gate electrode GE, the source electrode SE and the drain electrode DE may compose the thin film transistor TFT. A third insulation layer 150 may be formed on the second insulation layer 140 on which the thin film transistor TFT is formed. A contact hole exposing the drain electrode may be formed by partially etching the third insulation layer 150.

And then, a first electrode EL1 may be formed on the third insulation layer 150. The first electrode EL1 may be electrically connected to the drain electrode DE through the contact hole formed through the third insulation layer 150. A pixel defining layer 160 may be formed on the third insulation layer 150 on which the first electrode EL1 is formed.

The pixel defining layer 160 may define an opening corresponding to the transparent window W through which external light passes, and an opening corresponding to a pixel area in which light is emitted such as a first pixel area SP1, a second sub-pixel SP2 and a third sub-pixel SP3. The opening which corresponds to the transparent window W may have a third length L3 in the first direction.

Referring to FIG. 7C, A third light blocking pattern 165 may be formed on boundary side surfaces of the opening of the pixel defining layer 160 which corresponds to the transparent window W. Thus, a side surface of the pixel defining layer 160 may be covered by the third light blocking pattern 165.

The third light blocking pattern 165 may include material which can block light. The third light blocking pattern 165 may include organic material or inorganic material which can block the light. For example, a metal layer may be formed on the pixel defining layer 160, and the metal layer may be patterned into the third light blocking pattern 165. For example, the third light blocking pattern 165 may be a black matrix pattern including chrome.

Figure 7D:
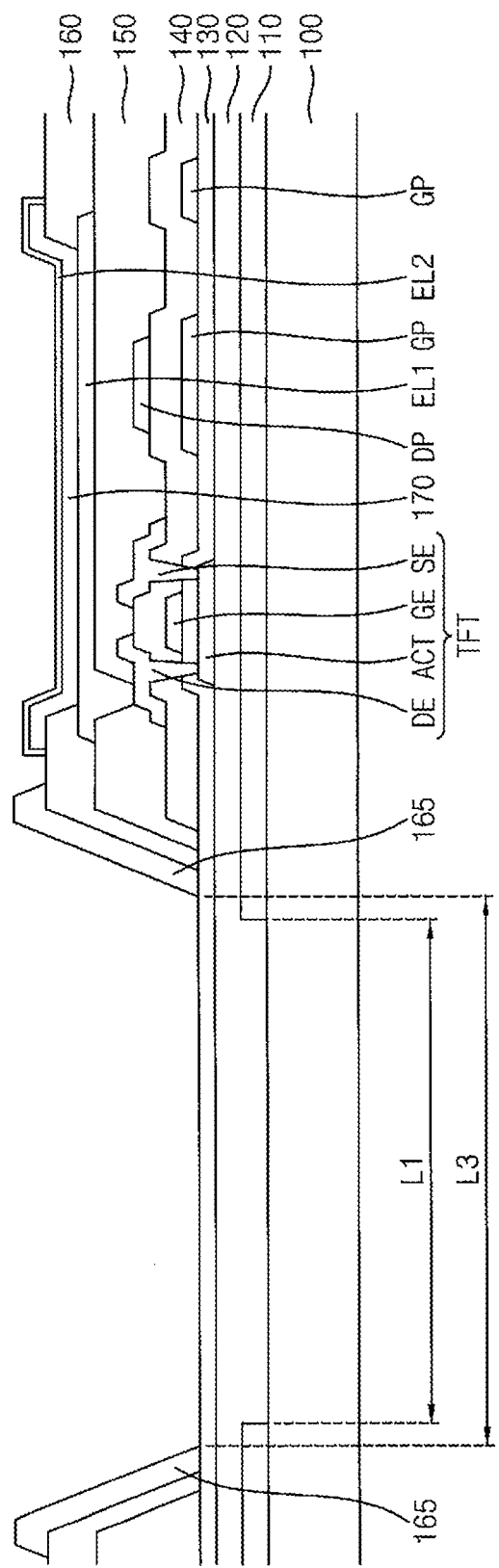

Referring to FIG. 7D, a light emitting structure 170 is formed on the first electrode EL1 exposed by the opening of the pixel defining layer 160. The light emitting structure 170 may be spaced apart from the third light blocking pattern 165. A second electrode EL2 may be formed on the pixel defining layer 160 and the light emitting structure 170.

Referring to FIG. 7E, a sealing substrate 200 may be provided. A second light blocking pattern 210 may be formed on the sealing substrate 200. A color filter CF may be formed on the sealing substrate 200 on which the second light blocking pattern 210 is disposed. The sealing substrate 200 on which the color filter CF is formed may be combined to the base substrate 100 on which the second electrode EL2 is formed to seal space between the base substrate 100 and the sealing substrate 200 by a sealing agent. A desiccant or a filler may be filled into the space 180.

FIGS. 8A to 8D are cross-sectional views illustrating a method of manufacturing the transparent organic light emitting display apparatus of FIG. 4.

Figure 8A:
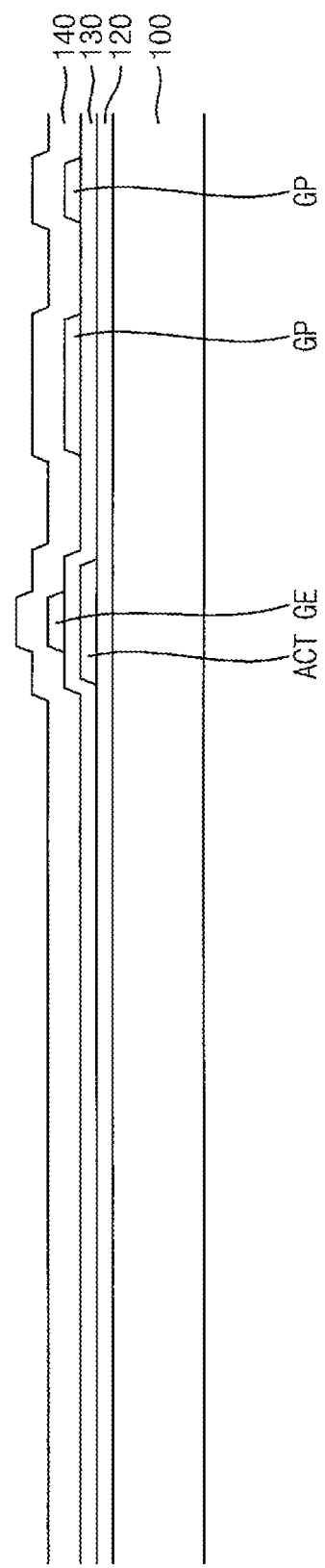

Referring to FIG. 8A, a buffer layer 120 may be formed on a base substrate 100. An active pattern ACT may be formed on the buffer layer 120. A first insulation layer 130 may be formed on the buffer layer 120 on which the active pattern ACT is formed. A gate pattern GP including a gate electrode GE may be formed on the first insulation layer 130. A second insulation layer 140 may be formed on the first insulation layer 130 on which the gate pattern GP is formed.

Figure 8B:
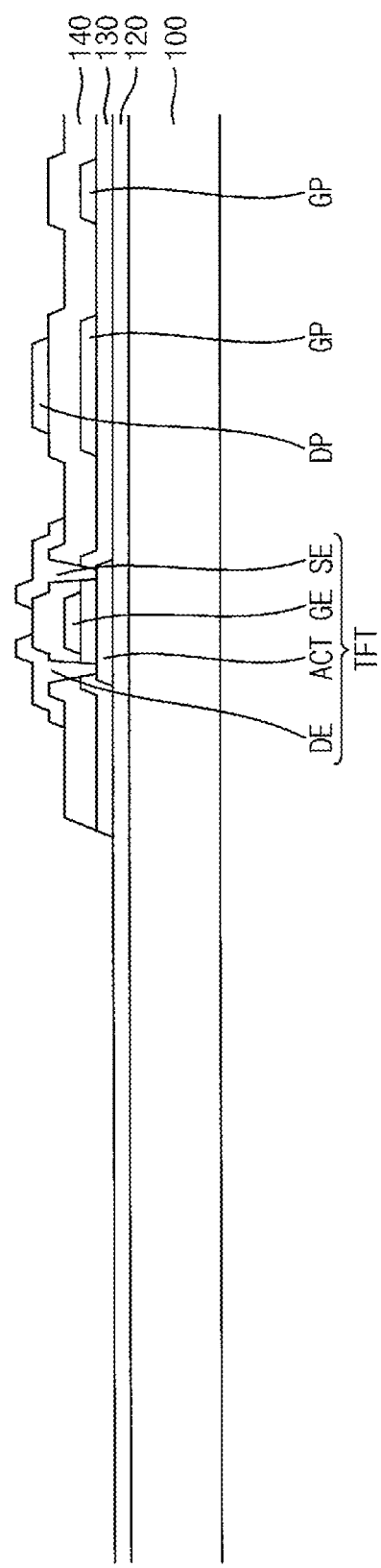

Referring to FIG. 8B, contact holes to expose the active pattern ACT may be formed by removing a portion of the first and second insulation layers 130 and 140. A portion of the buffer layer 120 where corresponding to a transparent window (refers to W of FIG. 8C) may be exposed by removing a portion of the first and second insulation layers 130 and 140. The first and second insulation layers 130 and 140 may be partially removed at the same time.

And then, a data pattern DP having a source electrode SE and a drain electrode DE may be formed on the second insulation layer 140. The source and drain electrodes SE and DE may be electrically connected to the active pattern ACT through the contact holes formed through the first and second insulation layers. The active pattern ACT, the gate electrode GE, the source electrode SE and the drain electrode DE may compose the thin film transistor TFT.

Referring to FIG. 8C, a third insulation layer 150 may be formed on the second insulation layer 140 on which the thin film transistor TFT is formed. A first electrode EL1 may be formed on the third insulation layer 150. A pixel defining layer 160 may be formed on the third insulation layer 150 on which the first electrode EL1 is formed.

The pixel defining layer 160 may define an opening corresponding to the transparent window W through which external light passes, and an opening corresponding to a pixel area in which light is emitted such as a first pixel area SP1, a second sub-pixel SP2 and a third sub-pixel SP3. The opening which corresponds to the transparent window W may have a third length L3 in the first direction.

A light emitting structure 170 is formed on the first electrode EL1 exposed by the opening of the pixel defining layer 160. A second electrode EL2 may be formed on the pixel defining layer 160 and the light emitting structure 170.

A second light blocking pattern 210 may be formed on a sealing substrate 200. The second light blocking pattern 210 may define an opening corresponding to the first sub-pixel SP1, a second sub-pixel SP2 and a third sub-pixel SP3 and an opening corresponding to the transparent window W. The opening corresponding to the transparent window W may have a second length L2 in the first direction.

A color filter CF may be formed on the sealing substrate 200 on which the second light blocking pattern 210 is disposed.

The sealing substrate 200 on which the color filter CF is formed may be combined to the base substrate 100 on which the second electrode EL2 is formed to seal space between the base substrate 100 and the sealing substrate 200 by a sealing agent. A desiccant or a filler may be filled into the space 180.

Referring to FIG. 8D, a first light blocking pattern 110 may be formed on an outer surface of the base substrate 100. Thus, the first light blocking pattern 110 may be formed on an opposite to the buffer layer 120 with respect to the base substrate 100. The first light blocking pattern 110 may include organic material or inorganic material which can block the light. For example, the first light blocking pattern 110 may be a black matrix pattern including chrome. In addition, the first light blocking pattern 110 may be a light blocking film attached on the base substrate 100.

Figure 9A:
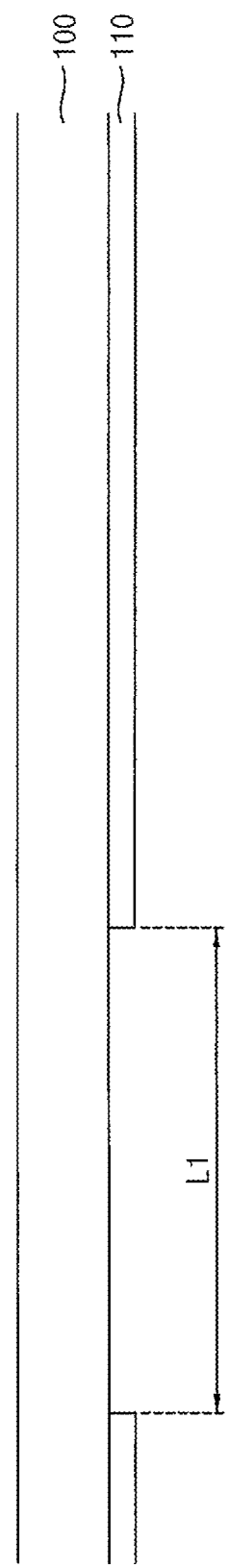

FIGS. 9A and 9B are cross-sectional views illustrating another method of manufacturing the transparent organic light emitting display apparatus of FIG. 4.

The method may be substantially same as the method of FIGS. 8A to 8D except manufacturing order of a first light blocking pattern. Thus, any further detailed descriptions concerning the same elements will be omitted.

Referring to FIG. 9A, a first light blocking pattern 110 may be formed on an outer surface of the base substrate 100. For example, the first light blocking pattern 110 may be a black matrix pattern including chrome. In addition, the first light blocking pattern 110 may be a light blocking film attached on the base substrate 100.

Referring to FIG. 9B, a buffer layer 120 may be formed on a base substrate 100. The buffer layer 120 may be formed opposite to the first light blocking pattern 110 with respect to the base substrate 100. And then, an active pattern ACT, a first insulation layer 130, a gate pattern GP, a second insulation layer 140, a data pattern DP, a third insulation layer 150, a pixel defining layer 160, a light emitting structure 170, and a second electrode EL2 may be formed. A second light blocking pattern 210 and a color filter CF may be formed on a sealing substrate 200. The sealing substrate 200 on which the color filter CF is formed may be combined to the base substrate 100 on which the second electrode EL2 is formed to seal space between the base substrate 100 and the sealing substrate 200 by a sealing agent.

FIGS. 10A to 10D are cross-sectional views illustrating a method of manufacturing the transparent organic light emitting display apparatus of FIG. 5.

Figure 10A:
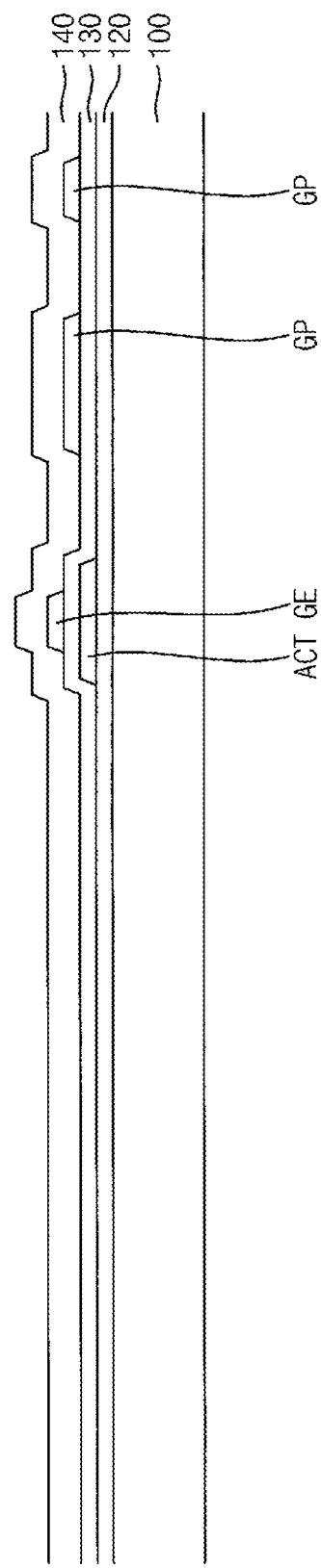
FIGS. 10A, 10B, 10C, 10D and 10E are cross-sectional views illustrating a method of manufacturing the transparent organic light emitting display apparatus of FIG. 5.

Referring to FIG. 10A. a buffer layer 120 may be formed on the base substrate 100. An active pattern ACT may be formed on the buffer layer 120. A first insulation layer 130 may be formed on the buffer layer 120 on which the active pattern ACT is formed. A gate pattern GP including a gate electrode GE may be formed on the first insulation layer 130. A second insulation layer 140 may be formed on the first insulation layer 130 on which the gate pattern GP is formed.

Figure 10B:
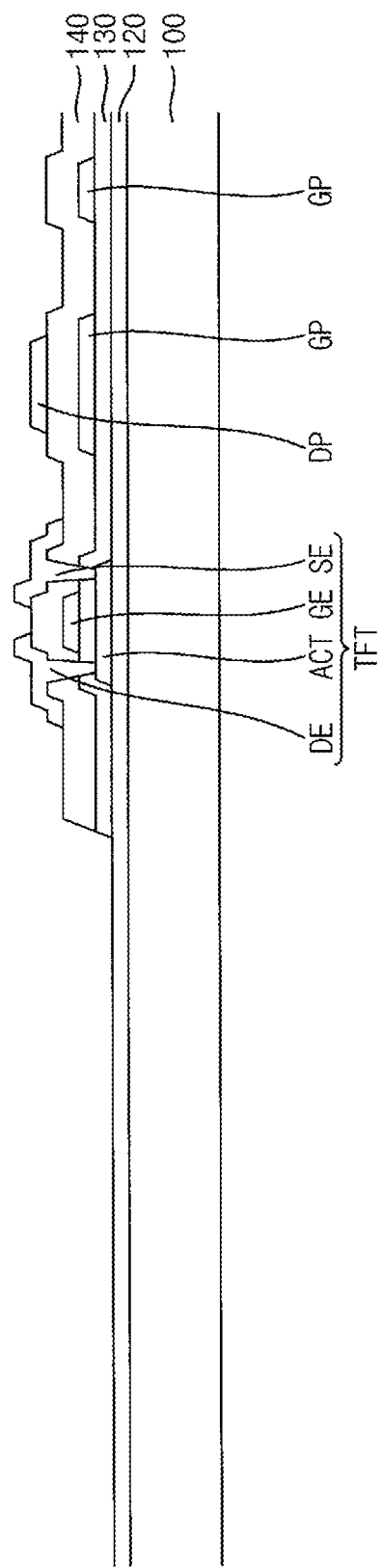

Referring to FIG. 10b, contact holes to expose the active pattern ACT may be formed by removing a portion of the first and second insulation layers 130 and 140. A portion of the buffer layer 120 where corresponding to a transparent window (refers to W of FIG. 8C) may be exposed by removing a portion of the first and second insulation layers 130 and 140.

And then, a data pattern DP having a source electrode SE and a drain electrode DE may be formed on the second insulation layer 140. The source and drain electrodes SE and DE may be electrically connected to the active pattern ACT through the contact holes formed through the first and second insulation layers. The active pattern ACT, the gate electrode GE, the source electrode SE and the drain electrode DE may compose the thin film transistor TFT.

Figure 10C:
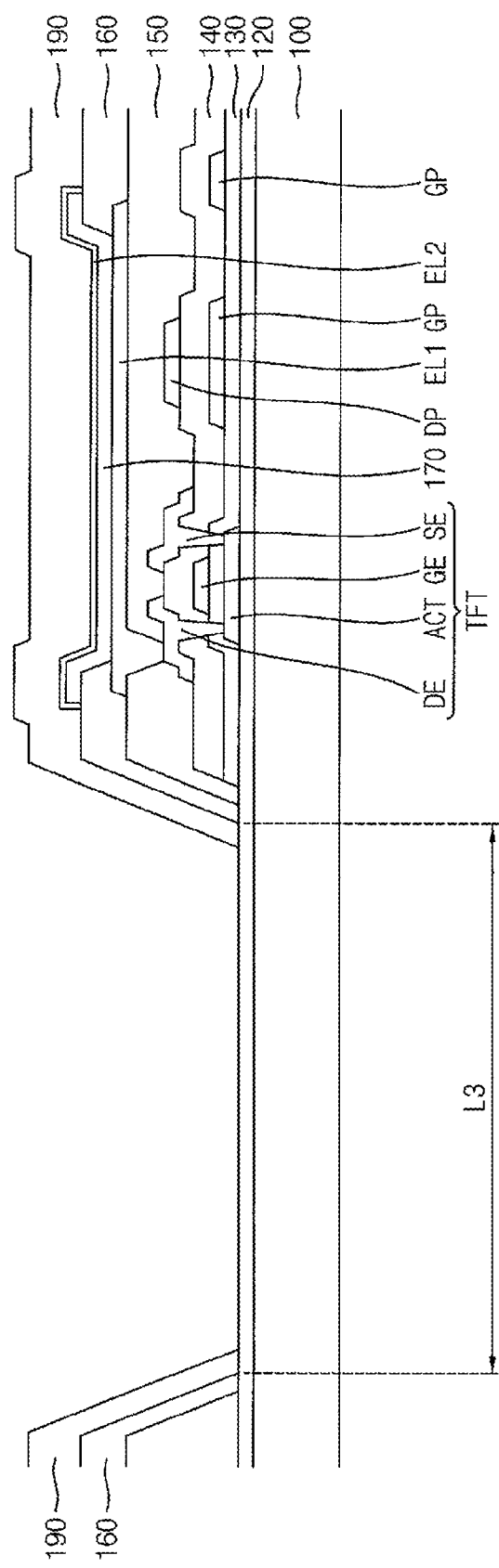

Referring to FIG. 10C, a third insulation layer 150 may be formed on the second insulation layer 140 on which the thin film transistor TFT is formed. A first electrode EL1 may be formed on the third insulation layer 150. A pixel defining layer 160 may be formed on the third insulation layer 150 on which the first electrode EL1 is formed.

The pixel defining layer 160 may define an opening corresponding to the transparent window W through which external light passes, and an opening corresponding to a pixel area in which light is emitted such as a first pixel area SP1, a second sub-pixel SP2 and a third sub-pixel SP3. The opening which corresponds to the transparent window W may have a third length L3 in the first direction.

A light emitting structure 170 is formed on the first electrode EL1 exposed by the opening of the pixel defining layer 160. A second electrode EL2 may be formed on the pixel defining layer 160 and the light emitting structure 170.

A TFE layer 190 may be disposed on the buffer layer 120, the pixel defining layer 160 and the second electrode EL2. The TFE layer 190 may include an inorganic film such as silicon oxide or silicon nitride film and an organic film such as epoxy or polyimide films which are alternately and repeatedly formed. However, example embodiments of TFE layer 190 may be not limited thereto, any structure of transparent thin film for sealing may be applied.

The TFE layer 190 may define an opening corresponding to the transparent window W. In one example embodiment, the TFE layer 190 may entirely cover the base substrate 100.

Figure 10D:
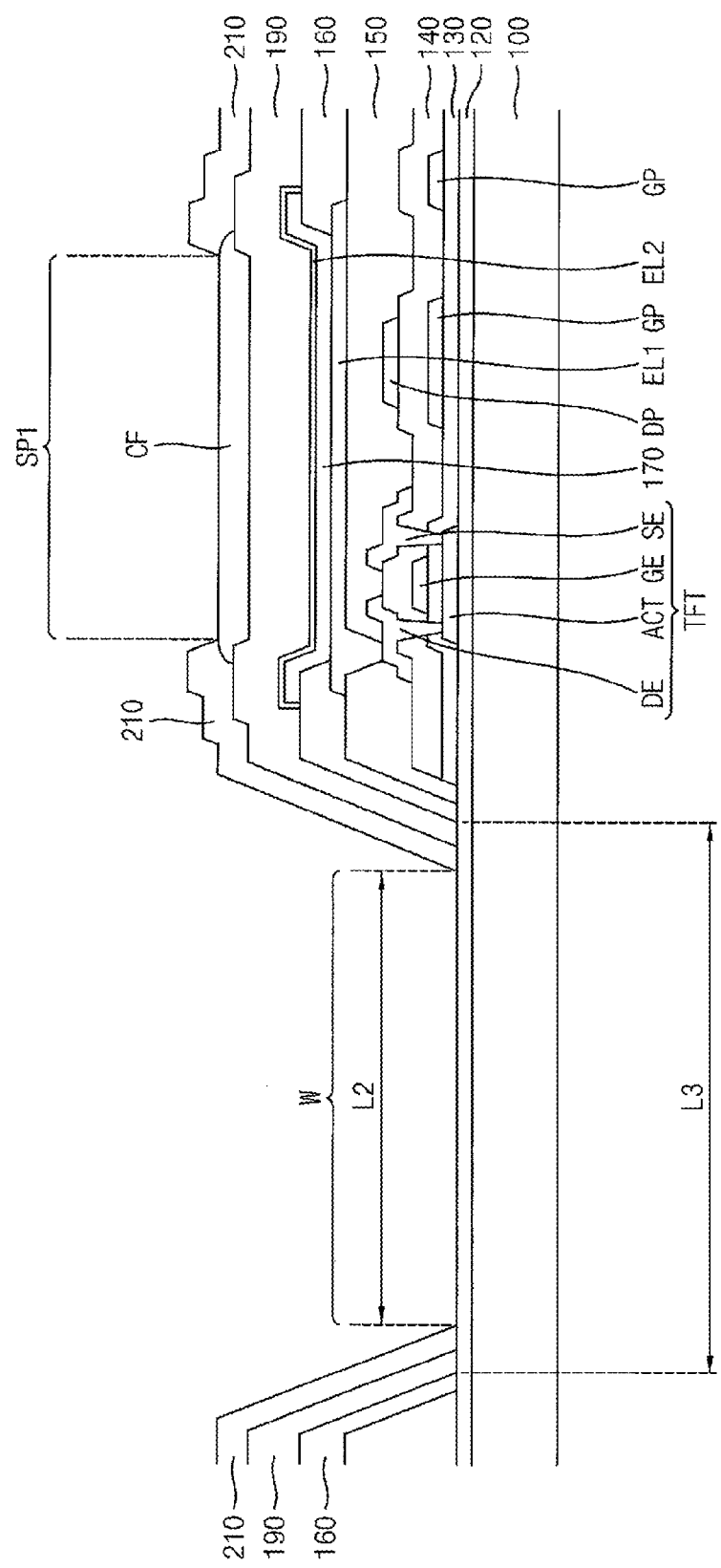

Referring to FIG. 10D, a color filter CF may be formed on the TFE layer 190. The second light blocking pattern 210 may be formed on the buffer layer 120, the TFE layer 190 and the color filter CF. The second light blocking pattern 210 may define an opening corresponding to the first sub-pixel SP1, a second sub-pixel SP2 and a third sub-pixel SP3 and an opening corresponding to the transparent window W. The opening corresponding to the transparent window W may have a second length L2 in the first direction.

Figure 10E:
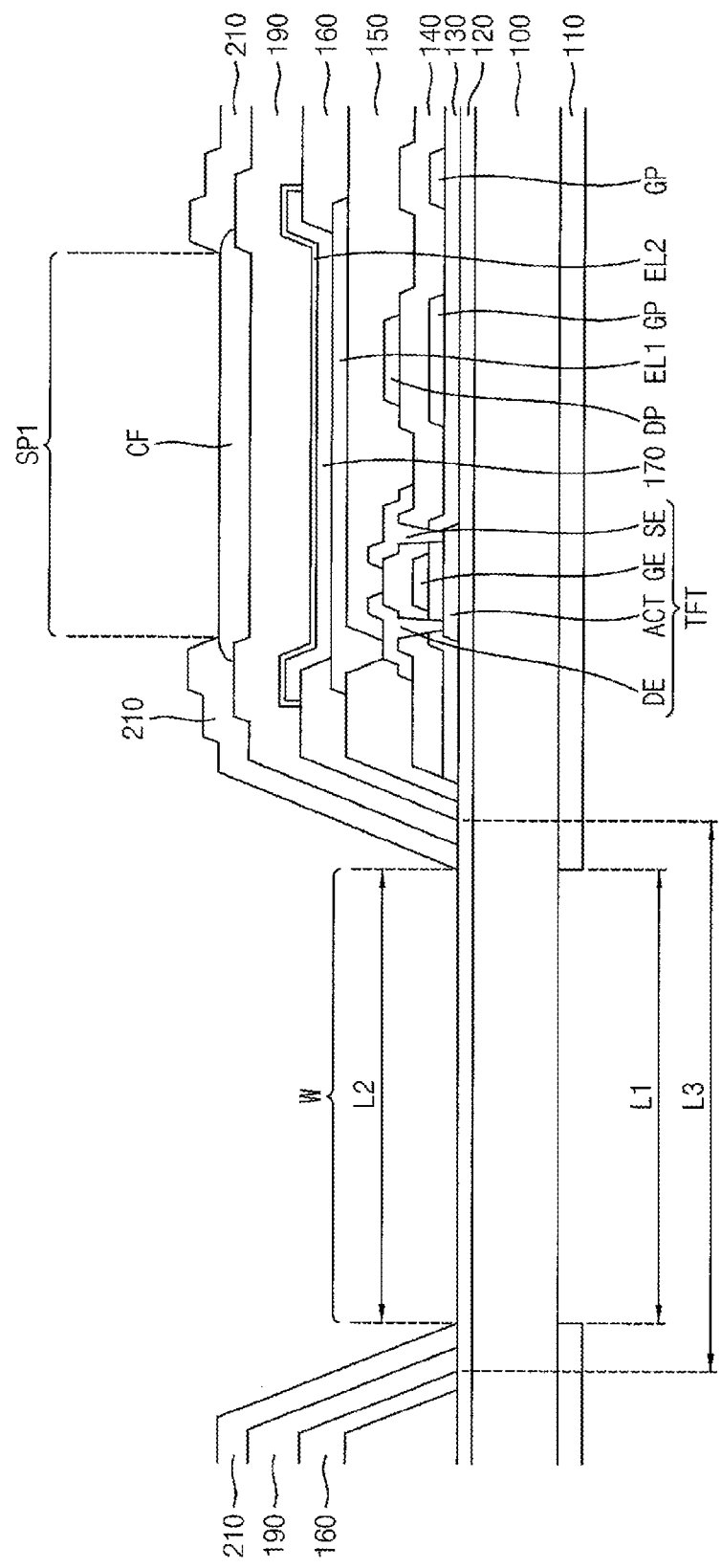

Referring to FIG. 10E, a first light blocking pattern 110 may be formed on an outer surface of the base substrate 100. Thus, the first light blocking pattern 110 may be formed on an opposite to buffer layer 120 with respect to the base substrate 100. The first light blocking pattern 110 may include organic material or inorganic material which can block the light. For example, the first light blocking pattern 110 may be a black matrix pattern including chrome. In addition, the first light blocking pattern 110 may be a light blocking film attached on the base substrate 100.

According to present example embodiments, a transparent organic light emitting display apparatus may include a pixel defining layer, a first light blocking pattern and a second light blocking pattern. A boundary of the pixel defining layer may be covered by the first light blocking pattern and the second light blocking pattern, so that reflection of external light passing a transparent window by elements of the transparent organic light emitting display apparatus may be decreased. Thus, quality of a transmitted image by the external light may be improved.

In addition, the transparent organic light emitting display apparatus may include a third light blocking pattern disposed on boundary side surfaces of an opening of the pixel defining layer which corresponds to the transparent window. Reflection of external light passing the transparent window by the elements of the transparent organic light emitting display apparatus may be decreased by the first to third light blocking patterns. Thus, quality of a transmitted image by the external light may be improved.

The present inventive concept may be applied to an organic light emitting display device, and an electronic device having the organic light emitting display device. For example, the present inventive concept may be applied to a computer monitor, a television, a laptop, a digital camera, a cellular phone, a smart-phone, a smart-pad, a personal digital assistants (PDA), a portable multimedia player (PMP), an MP3 player, a navigation system, a video-phone, etc.

The foregoing is illustrative of the inventive concept and is not to be construed as limiting thereof. Although a few example embodiments of the inventive concept have been described, those skilled in the art will readily appreciate that many modifications are possible in the example embodiments without materially departing from the novel teachings and advantages of the inventive concept. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific example embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A transparent organic light emitting display apparatus comprising:
   a base substrate;
   a first light blocking pattern disposed on the base substrate;
   a thin film transistor disposed on the base substrate;
   a first electrode disposed on the base substrate and electrically connected to the thin film transistor;
   a pixel defining layer disposed on the base substrate and overlapping the first light blocking pattern;
   a second electrode disposed on the base substrate;
   a light emitting structure disposed between the first electrode and the second electrode; and
   a second light blocking pattern overlapping the first light blocking pattern,
   wherein the first light blocking pattern defines a first opening, the second light blocking pattern defines a second opening which overlaps the first opening, and the pixel defining layer defines a third opening which overlaps the first and second openings configured to pass external light through the first to third openings, and
   wherein a width of the second opening is smaller than a width of the third opening.

2. The transparent organic light emitting display apparatus of claim 1, wherein a width of the first opening is smaller than a width of the third opening opening.

3. The transparent organic light emitting display apparatus of claim 1, wherein a width of the first opening is substantially same as the width of the second opening.

4. The transparent organic light emitting display apparatus of claim 1, wherein a gap between a boundary of the first opening and a boundary of the third opening is about 1 μm to about 5 μm in a plan view, and
   a gap between a boundary of the second opening and a boundary of the third opening is about 1 μm to about 5 μm in a plan view.

5. The transparent organic light emitting display apparatus of claim 4,
   wherein the gap between the boundary of the first opening and the boundary of the third opening is uniform.

6. The transparent organic light emitting display apparatus of claim 1, wherein the first light blocking pattern is disposed opposite to the thin film transistor with respect to the base substrate.

7. The transparent organic light emitting display apparatus of claim 1, further comprising a third light blocking pattern disposed on the pixel defining layer and spaced apart from the light emitting structure,
   wherein the third light blocking pattern defines a fourth opening which covers a boundary of the third opening and overlaps the first and second openings.

8. The transparent organic light emitting display apparatus of claim 7, wherein a width of the first opening is smaller than a width of the fourth opening, and the width of the second opening is smaller than a width of the fourth opening.

9. The transparent organic light emitting display apparatus of claim 1, further comprising a color filter disposed on the second electrode,
   wherein the second light blocking pattern makes contact with the color filter.

10. The transparent organic light emitting display apparatus of claim 9, further comprising a sealing substrate disposed on the color filter and the second light blocking pattern.

11. The transparent organic light emitting display apparatus of claim 1, further comprising a buffer layer covering the base substrate,
    wherein the buffer layer is disposed between the base substrate and the thin film transistor, and the first light blocking pattern is disposed between the buffer layer and the base substrate.

12. The transparent organic light emitting display apparatus of claim 11, further comprising a first insulation layer disposed on the buffer layer and a second insulation layer disposed on the first insulation layer,
    wherein the first and second insulation layers define an opening where the first to third openings are overlapped each other.

13. The transparent organic light emitting display apparatus of claim 12, further comprising:
    a thin film encapsulation layer comprising a plurality of organic films and inorganic films which are alternately stacked;
    a color filter disposed on the thin film encapsulation layer and overlapping the light emitting structure, and
    wherein the second light blocking pattern is disposed on the thin film encapsulation layer and configured to expose the color filter.

14. The transparent organic light emitting display apparatus of claim 1, wherein the first light blocking pattern makes contact with the base substrate.

15. A method of manufacturing a transparent organic light emitting display apparatus comprising:
    forming a first light blocking pattern on a base substrate;
    forming a thin film transistor on the base substrate;
    forming a pixel defining layer on the base substrate on which the thin film transistor is formed;
    forming a light emitting structure on the base substrate on which the pixel defining layer is formed; and
    forming a second light blocking pattern overlapping the pixel defining layer, and
    wherein the first light blocking pattern defines a first opening, the second light blocking pattern defines a second opening which overlaps the first opening, the pixel defining layer defines a third opening which overlaps the first and second openings, and the first to third openings are configured to pass external light therethrough, and
    wherein a width of the second opening is smaller than a width of the third opening.

16. The method of claim 15, further comprising forming a third light blocking pattern on the pixel defining layer before forming the light emitting structure,
    wherein the third light blocking pattern is spaced apart from the light emitting structure.

17. The method of claim 15, further comprising forming a color filter overlapping the light emitting structure before forming the second light blocking pattern.

18. The method of claim 15, further comprising forming a buffer layer on the base substrate on which the first light blocking pattern is formed before forming the thin film transistor.

19. The method of claim 15, wherein the first light blocking pattern is formed by attaching a light blocking film on the base substrate.

20. A transparent organic light emitting display apparatus comprising a transparent window configured to pass external light therethrough and a pixel configured to display an image, the transparent organic light emitting display apparatus comprising:

a first light blocking pattern defining a first opening corresponding to the transparent window;

a second light blocking pattern overlapping the first light blocking pattern; and an opaque elements disposed between the first light blocking pattern and the second light blocking pattern, and wherein the second light blocking pattern defines a second opening overlapping the first opening, the opaque elements define a third opening overlapping the first opening and the second opening, and wherein the third opening is substantially larger than the first opening and the second opening.

* * * * *